US005580388A

United States Patent [19]

Moore

[11] Patent Number: 5,580,388
[45] Date of Patent: Dec. 3, 1996

[54] MULTI-LAYER SUSCEPTOR FOR RAPID THERMAL PROCESS REACTORS

[75] Inventor: Gary M. Moore, Monte Sereno, Calif.

[73] Assignee: Moore Epitaxial, Inc., San Jose, Calif.

[21] Appl. No.: 453,419

[22] Filed: May 30, 1995

Related U.S. Application Data

[63] Continuation-in-part of Ser. No. 185,691, Jan. 21, 1994, which is a continuation-in-part of Ser. No. 7,981, Jan. 21, 1993, Pat. No. 5,444,217.

[51] Int. Cl.$^6$ ............................................. C23C 16/00
[52] U.S. Cl. ............................. 118/728; 118/500; 118/729
[58] Field of Search ................................ 118/500, 728, 118/729

[56] References Cited

U.S. PATENT DOCUMENTS

| | | | |
|---|---|---|---|
| 3,783,822 | 1/1974 | Wollam | 118/49.1 |
| 3,836,751 | 9/1974 | Anderson | 219/411 |
| 3,862,397 | 1/1975 | Anderson | 219/405 |
| 3,916,822 | 11/1975 | Robinson | 118/49 |
| 4,047,496 | 9/1977 | McNeilly | 118/49.1 |
| 4,081,313 | 3/1978 | McNeilly et al. | 156/610 |
| 4,101,759 | 7/1978 | Anthony et al. | 219/343 |
| 4,113,547 | 9/1978 | Katz . | |
| 4,493,977 | 1/1985 | Arai et al. | 219/411 |
| 4,497,683 | 2/1985 | Celler et al. | 156/603 |
| 4,511,788 | 4/1985 | Arai et al. | 219/405 |
| 4,533,820 | 8/1985 | Shimizu | 219/411 |
| 4,540,876 | 9/1985 | McGinty | 219/405 |
| 4,545,327 | 10/1985 | Cambell | 118/725 |
| 4,550,245 | 10/1985 | Arai et al. | 219/405 |
| 4,649,261 | 3/1987 | Sheets | 219/390 |
| 4,680,451 | 7/1987 | Gat et al. | 219/411 |
| 4,755,654 | 7/1988 | Crowley | 219/405 |
| 4,789,771 | 12/1988 | Robinson et al. | 219/405 |
| 4,796,562 | 1/1989 | Brors | 118/725 |
| 4,798,165 | 1/1989 | deBoer et al. | 118/715 |
| 4,821,674 | 4/1989 | deBoer et al. | 118/666 |
| 4,823,735 | 4/1989 | Pichel | 118/730 |
| 4,828,224 | 5/1989 | Crabb et al. | 251/298 |
| 4,836,138 | 6/1989 | Robinson et al. | 118/666 |
| 4,851,358 | 7/1989 | Huber | 437/10 |
| 4,857,689 | 8/1989 | Lee | 219/10.71 |
| 4,920,918 | 5/1990 | Adams et al. | 118/724 |
| 4,924,807 | 5/1990 | Nakayama | 118/725 |
| 4,951,601 | 8/1990 | Maydan et al. | 118/719 |
| 4,978,567 | 12/1990 | Miller | 428/157 |
| 4,986,838 | 1/1991 | Johnsgard | 55/223 |

(List continued on next page.)

FOREIGN PATENT DOCUMENTS

| | | | |
|---|---|---|---|
| 448346 | 9/1991 | European Pat. Off. | 118/728 |
| 3942931 | 6/1990 | Germany | 118/728 |
| 279624 | 12/1987 | Japan | 118/728 |
| 96912 | 4/1988 | Japan | 118/728 |
| 201429 | 4/1991 | Japan | 118/728 |
| 6826 | 1/1992 | Japan | 118/728 |

OTHER PUBLICATIONS

J. G. Kren, Technique to Deposit Thick Films Without Warping or Breaking Wafers, 5165, IBM Technical Disclosures Bulletin vol. 7 No. 12 p. 1119.

Edited by B. J. Baliga, "Epitaxial Silicon Technology," Academic Press, Inc., 1986, pp. 56–67.

*Primary Examiner*—R. Bruce Breneman
*Assistant Examiner*—Jeffrie R. Lund
*Attorney, Agent, or Firm*—Skjerven Morrill MacPherson Franklin & Friel; Forrest E. Gunnison

[57] ABSTRACT

A multi layer RTP reactor susceptor includes a first layer which has a multiplicity of thin components that are preferably silicon carbide, graphite, or silicon carbide coated graphite with a thickness less than about 6 mm, with an emissivity such that the first layer radiates heat, and with thermal heat transfer characteristics such that the first layer facilitates maintaining a substrate or substrates supported by the susceptor at a uniform temperature, and facilitates maintaining uniform process gas characteristics over the substrates. A second layer of the susceptor is transparent to the heat source of the RTP reactor and provides a rigid, stable platform for the first layer.

23 Claims, 33 Drawing Sheets

U.S. PATENT DOCUMENTS

| | | | |
|---|---|---|---|
| 4,989,540 | 2/1991 | Fuse | 118/719 |
| 5,000,113 | 3/1991 | Wang | 118/723 |
| 5,034,199 | 7/1991 | Zavracky | 219/411 |
| 5,044,943 | 9/1991 | Bowman | 432/121 |
| 5,053,247 | 10/1991 | Moore | 427/55 |
| 5,074,017 | 12/1991 | Toya | 118/725 |
| 5,077,875 | 1/1992 | Hoke | 118/730 |
| 5,098,198 | 3/1992 | Nulman et al. | 374/121 |
| 5,104,276 | 4/1992 | Severns et al. | 414/222 |
| 5,106,200 | 4/1992 | Hosokawa | 374/121 |
| 5,108,792 | 4/1992 | Anderson | 427/248.1 |
| 5,169,684 | 12/1992 | Takagi | 427/248.1 |
| 5,192,371 | 3/1993 | Shuto | 118/728 |
| 5,228,501 | 7/1993 | Tepman | 165/80.1 |
| 5,252,807 | 10/1993 | Chizinsky | 219/390 |
| 5,334,257 | 8/1994 | Nishi | 118/500 |
| 5,366,002 | 11/1994 | Tepman | 165/1 |
| 5,387,557 | 2/1995 | Takagi | 437/247 |
| 5,439,850 | 8/1995 | Öztürk | 437/228 |
| 5,444,217 | 8/1995 | Moore | 219/405 |

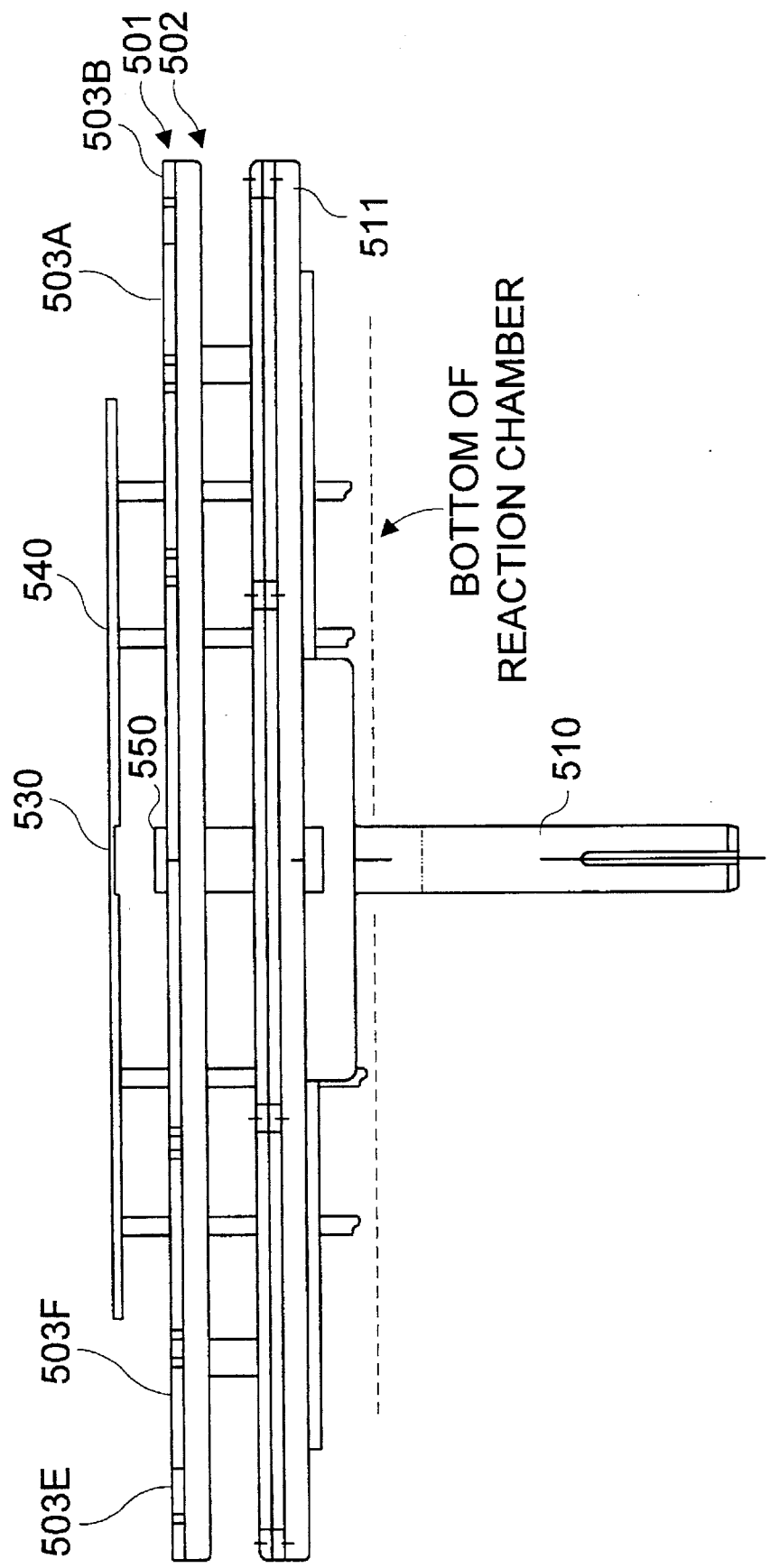

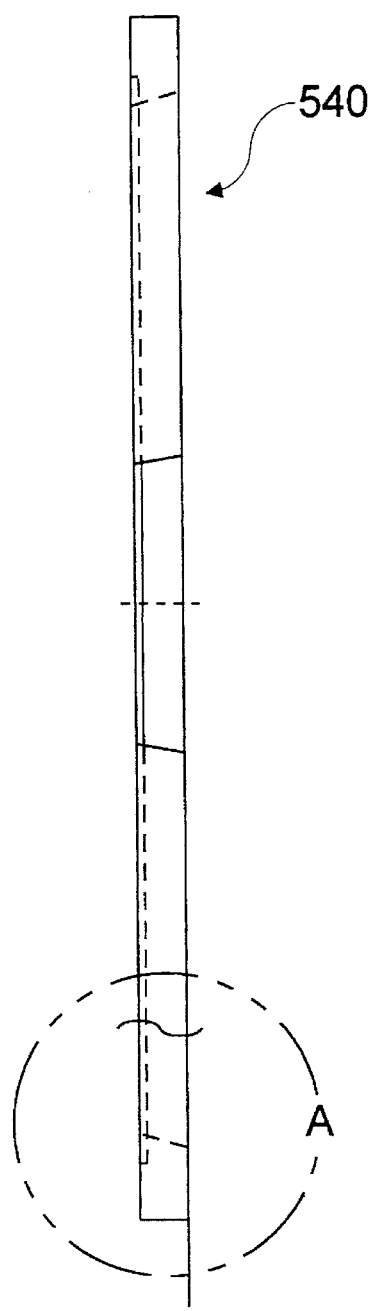
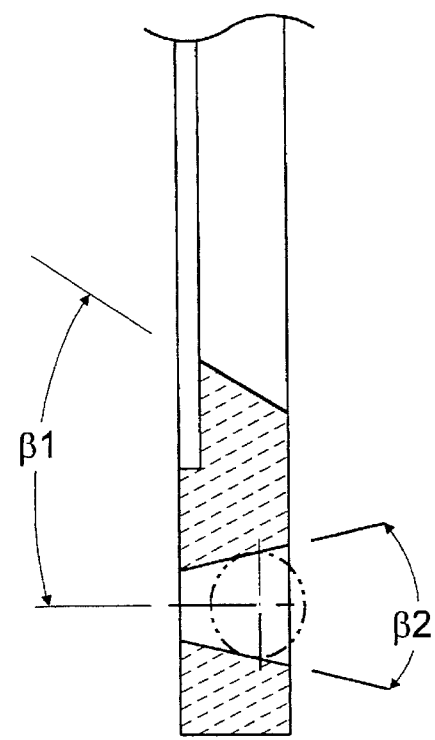
FIG. 7C
FIG.7B

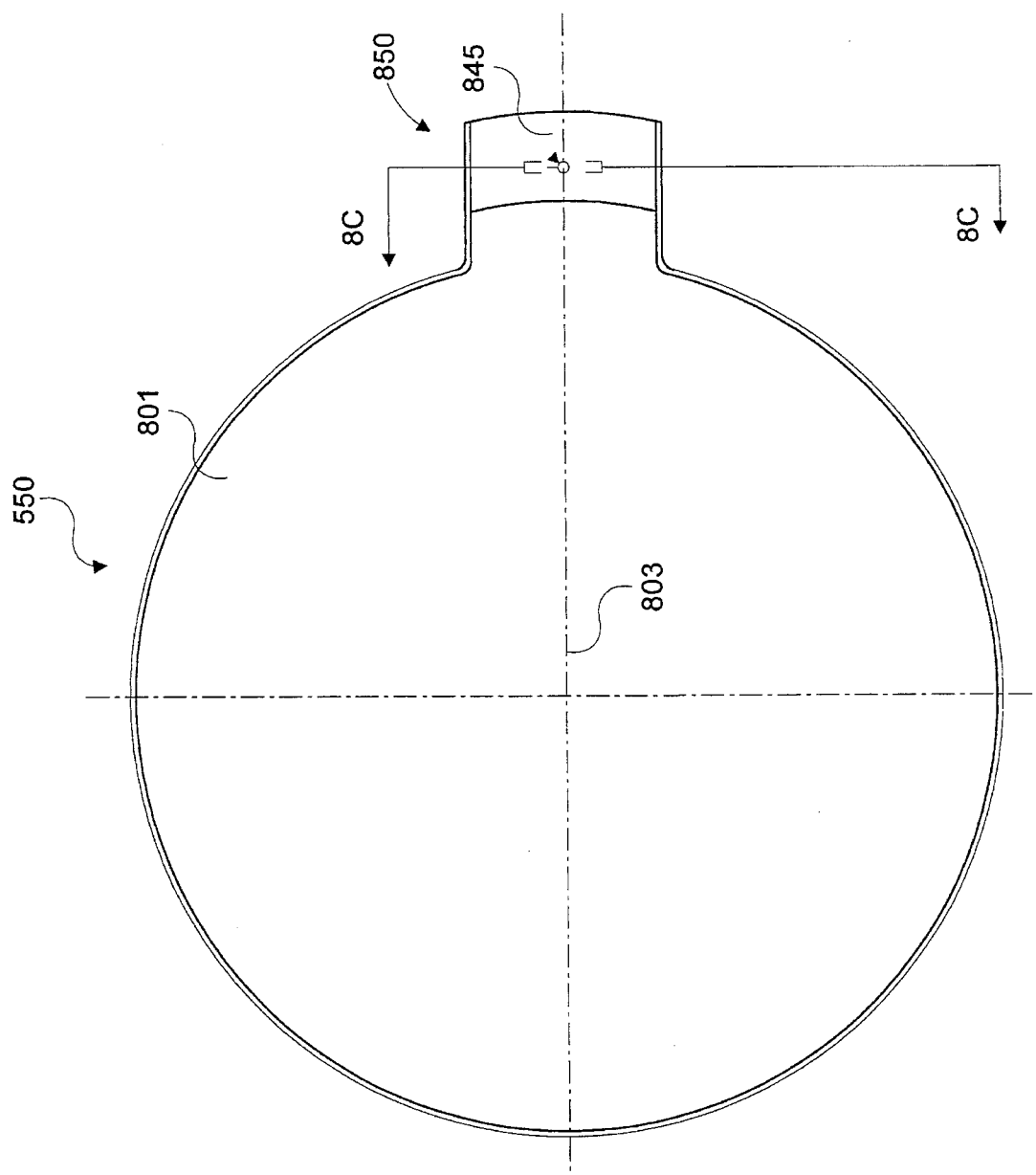

5,580,388

MULTI-LAYER SUSCEPTOR FOR RAPID THERMAL PROCESS REACTORS

RELATED APPLICATIONS

This application is a continuation-in-part of U.S. patent application Ser. No. 08/185,691 now pending entitled "A RAPID THERMAL PROCESSING APPARATUS FOR PROCESSING SEMICONDUCTOR WAFERS," of Gary M. Moore, and Katsuhito Nishikawa filed on Jan. 21, 1994 which was a continuation-in-part of U.S. patent application Ser. No. 08/007,981 now U.S Pat. No. 5,444,217 entitled "A RAPID THERMAL PROCESSING APPARATUS FOR PROCESSING SEMICONDUCTOR WAFERS," of Gary M. Moore and Katsuhito Nishikawa filed on Jan. 21, 1993.

FIELD OF THE INVENTION

This invention relates generally to supports for substrates that are used when depositing a layer on the substrates, and more specifically to supports for substrates processed in a rapid thermal process reactor.

DESCRIPTION OF RELATED ART

Deposition of a film on the surface of a semiconductor wafer or other substrate is a common step in semiconductor processing, and flat panel display processing. Typically, selected chemical gases are mixed in a deposition chamber containing a semiconductor wafer. Usually, heat is applied to drive the chemical reaction of the gases in the chamber and to heat the surface of the wafer on which the film is deposited.

In deposition processes, it is desirable to maximize wafer throughput (i.e., the number of wafers processed per unit time), while depositing uniform film layers. Typically, to obtain uniform film layers, it is important to maintain the wafer at a uniform temperature.

A number of different deposition reactors have been developed. Generally, each deposition reactor has a reaction chamber, a wafer handling system, a heat source and temperature control, and a gas delivery system (inlet, exhaust, flow control).

FIG. 1A is a simplified cross-sectional view of one type of prior art deposition reactor 100, known as a horizontal furnace, in which susceptor 101 was positioned in horizontal tube 102 (usually of rectangular cross-section), the interior of which is the reaction chamber. Semiconductor wafers, e.g., wafer 103a, 103b, 103c were mounted on surface 101a of susceptor 101. Heat source 104 heated the wafers, and reactant gases 105 were flowed through tube 102 past the wafers. Susceptor 101 was often tilted and not rotated, as shown in FIG. 1A, so that surface 101a faced into the flow of reactant gases 105 to minimize the problem of reactant depletion in the vicinity of the wafers near the end of the flow of reactant gases 105.

FIG. 1B is a simplified orthogonal view of another type of prior art reactor 110, known as a barrel reactor, in which susceptor 111 is suspended in the interior of bell jar 112 which defines the reaction chamber. Semiconductor wafers, e.g., wafer 113 are mounted substantially vertically on the sides, e.g., side 111a, of susceptor 111. Heat source 114 heats the wafers, and reactant gases are introduced through gas inlet 115 into the top of bell jar 112. The gases pass down the length of susceptor 111, over the surfaces of the wafers, and are exhausted from the reaction chamber through a gas outlet (not shown) at the bottom of bell jar 112.

FIG. 1C is a simplified cross-sectional view of yet another type of prior art conventional chemical vapor deposition reactor 120, known as a pancake reactor, in which vertically fixed susceptor 121 is supported from the bottom of bell jar 122 which defines the reaction chamber. Semiconductor wafers, e.g., wafer 123, are mounted horizontally on surface 121a of susceptor 121. The wafers are heated by a RF heat source (not shown), and reactant gases are introduced into the reaction chamber above the wafers through susceptor support 125. The gases flow down over the wafers and are exhausted through a gas outlet (not shown) at the bottom of bell jar 122.

In each of these prior art reactors, the susceptor functions as thermal flywheel. Specifically, the thermal mass of the susceptor was substantially greater than the thermal mass of the wafers on the susceptor, and the susceptor was made of a material that absorbs the energy of the heat source, and that conducts heat. Consequently, when the susceptor is heated to an operating temperature, the large thermal mass of the susceptor tends to maintain each region of the susceptor at a particular temperature. Since the wafers are supported by the susceptor, the constant temperature of the susceptor helps to minimize undesirable thermal gradients in the wafer.

While a susceptor with a large thermal mass is necessary for obtaining uniform deposition, the large thermal mass limits the throughput of the reactor. Specifically, the susceptor must be heated and cooled down for each batch of wafers processed. Typically, the heat up and cool down periods are limiting factors in the total time required to process a batch of wafers. Conventional reactors take on the order of 40 to 90 minutes for a complete process cycle of a batch of wafers.

Rapid thermal process (RTP) reactors, on the other hand, typically require only 2 to 15 minutes to process a wafer. Thus, rapid thermal reactors are characterized by a process cycle time that is significantly less that the process cycle time for a conventional reactor. Moreover, while the thermal flywheel characteristics of a susceptor are desirable for a RTP reactor, the time delays associated with a large thermal mass are unacceptable.

For example, U.S. Pat. No. 5,098,198, entitled "Wafer Heating and Monitor Module and Method of Operation," of Nulman et al. and issued on Mar. 24, 1992 describes a thin, constant emissivity susceptor 213 (FIG. 2) for providing fast thermal response between susceptor 213 and a wafer 214 that is supported by susceptor 213. Susceptor 213 is formed of either graphite coated with silicon carbide or solid silicon carbide. Susceptor 213 is described as being very thin, typically 0.5 mm to 8 mm and preferably 2 mm to provide a very fast thermal response time. Neither the diameter of the susceptor nor the wafer is described, but the susceptor is shown and described as supporting a single wafer.

U.S. Pat. No. 4,978,567, entitled "Wafer Holding Fixture for Chemical Reaction Processes in Rapid Thermal Processing Equipment and Method For Making Same," of M. Miller and issued on Dec. 18, 1990 describes yet another single wafer susceptor for a RTP reactor. A first susceptor 300, (FIG. 3A) that is made of silicon carbide, has an upper planar surface 302, that includes a recess 304 for supporting the wafer, and a side wall 303. Planar surface 302 and side wall 303 have a thickness in the range of about 0.38 mm (0.015 inches) to about 0.64 mm (0.025 inches). However, such thin surfaces, while having a fast thermal response, have trouble providing the required stability and rigidity.

Consequently, a second silicon carbide susceptor 310 (FIG. 3B) has an upper planar surface 312 with a recess 317, a sidewall 313, and a hollow annular section 314. The width of hollow annulus 314 from inner sidewall 320 to sidewall 313 was less than 50% of the distance from inner rim 315 to outer rim 316 of planar surface 312 so that annulus 314 was sufficiently removed from the proximity of the supported wafer so as to not inhibit the thermal response of the wafer upon heating. However, most likely, the difference in thermal mass between annulus 314 and planar surface 312 results in the two regions being heated to different temperatures so that thermal gradients exist in susceptor 310. Such gradients may lead to bowing, warping, or cracking of the susceptor which inhibits uniform process results from batch to batch. Specifically, if susceptor 310 warps, the surface of the substrate is exposed to different processing conditions within the reactor caused by the irregular surface of susceptor 310. Also if the susceptor is made of silicon carbide, the susceptor is likely to crack rather than warp.

In another RTP reactor described in U.S. Pat. No. 5,108,792, entitled "Double-Dome Reactor For Semiconductor Processing," issued on Apr. 28, 1992 to Anderson et al, the susceptor is described as a thin plate for low thermal mass and a rim for rigidity. However, this patent fails to describe the size of the single wafer support or the susceptor. The only teaching provided is that the susceptor has a low thermal mass, but this fails to describe the relationship between the wafer, the rim and the thin plate. This patent also stated that the RTP reactor system is contemplated that does not include a susceptor so that heating and cooling times are limited primarily by the thermal mass of the wafer.

Most conventional CVD reactors process multiple wafer batches. Susceptors with large thermal masses can be adapted to support multiple wafers. However, most RTP reactors have been used to process a single wafer. As indicated above, the dominant approach for an RTP susceptor appears to be use of a thin planar surface supported by a more massive outer rim. Unfortunately, as the thin planar surface becomes larger, the thin planar surface does not have sufficient stability and rigidity to support either a single large wafer or multiple wafers. A stable and rigid graphite or silicon carbide coated graphite susceptor that can support either a single large wafer or multiple wafers has too great a thermal mass for use in RTP reactors, if it is important to maintain the RTP cycle characteristics.

SUMMARY OF THE INVENTION

According to the principles of this invention, a RTP reactor susceptor is a multi-layer structure. A first layer of the RTP susceptor includes a multiplicity of thin components that are preferably silicon carbide, graphite, or silicon carbide coated graphite with a thickness less than about 6 mm, with an emissivity such that the first layer radiates heat, and with thermal heat transfer characteristics such that the first layer facilitates maintaining a substrate or substrates supported by the susceptor at a uniform temperature, and facilitates maintaining uniform process gas characteristics over the substrates. A second layer of the susceptor is transparent to the heat source of the RTP reactor and provides a rigid, stable platform for the first layer.

The support and rigidity provided by the transparent second layer allows use of the thin first layer that by itself does not have sufficient rigidity to support a single large substrate, e.g., a 300 mm diameter semiconductor wafer, or multiple substrates. Thus, the combination of the thickness of the first and second layers provides sufficient stability and rigidity to support either a single large substrate or multiple substrates simultaneously, but since the second layer does not absorb heat, the thermal mass of the susceptor is determined by the first layer and is compatible with the process cycles in a RTP reactor.

Preferably, the first layer includes a substrate surround ring and a plurality of heat distribution elements. The plurality of components eliminates problems with bowing, warping, or cracking. In addition, since the first layer has uniform thermal properties, problems introduced by the difference in thermal properties between a thin central region and a more massive support structure at the outer circumference the thin central region, as in the prior art RTP susceptors, have been eliminated. Also, the uniform geometry of the first layer facilitates manufacturing of the layer and uniform process gas properties. The two layer susceptor of this invention can be used with any heat source or combination of heat sources typically found in an RTP reactor.

Thus, according to the principles of this invention, a rapid thermal process reactor susceptor has a first layer comprising a plurality of components where the plurality of components include (i) a substrate surround ring, and (ii) a plurality of heat distribution elements positioned about and adjacent to the substrate surround ring. A second layer of the susceptor has a first surface and a second surface opposite the first surface where the plurality of components of the first layer is mounted on the first surface of the second layer so that the second layer supports the first layer. In this embodiment, the second layer is substantially transparent to heat energy in the RTP reactor so that a thermal mass of the susceptor is defined by characteristics of the first layer.

The plurality of components in the first layer also includes a substrate surround ring insert having a circumferential edge surface where the circumferential edge surface of the substrate surround ring insert is adjacent to an inner circumferential edge surface of the substrate surround ring. Preferably the substrate surround ring insert circumferential edge surface and substrate surround ring inner circumferential surface are beveled so that the substrate surround ring can be lifted away from the substrate surround ring insert without displacing the substrate surround ring insert.

In one embodiment, the substrate surround ring has a shelf about an inner circumferential edge surface of the substrate surround ring where the shelf extends a predetermined distance from the inner circumferential edge surface of the substrate surround ring towards an outer circumferential edge surface so that a substrate placed in the substrate surround ring is supported by the shelf. The substrate surround ring also has a rim about an outer circumferential edge surface of the substrate surround ring where an intersection of an inner circumferential edge surface of the rim and the shelf defines an outer edge of the shelf. Thus, the inner circumferential edge surface of the rim forms a wall that extends from the shelf to a top of the rim. The wall has a height that is about twice a thickness of the substrate. Also, the outer edge of the shelf is positioned so that a gap between the wall and an edge of the substrate is in the range of about 0.05 inches (0.13 cm) to 0.2 inches (0.51 cm) and in one embodiment is about 0.0625 inches (0.16 cm).

In another embodiment, the first layer of the susceptor includes a substrate surround ring having an inner circumferential edge surface with a plurality of lift tabs extending from the inner circumferential edge surface, and a substrate surround ring insert having a plurality of notches in an outer circumferential edge surface so that the substrate surround ring insert fits in and mates with the substrate surround ring.

The plurality of heat distribution elements are arranged about and adjacent to the substrate surround ring so that a first gap is formed between adjacent edge surfaces of the heat distribution elements, and a second gap is formed between edge surfaces of the heat distribution elements and the outer circumferential edge surface of the substrate surround ring. Each of the plurality of heat distribution elements includes a notch in an outer circumferential edge surface. The second layer has a plurality of pins extending from a surface of the second layer and positioned adjacent to an outer circumferential edge of the second layer. The notch in the heat distribution element fits about one of the pins.

BRIEF DESCRIPTION OF THE DRAWINGS

FIG. 5C is an illustration of a two layer RTP susceptor, according to the principles of this invention, with the substrate and substrate surround ring in an elevated position.

FIG. 7B is an end view of the substrate surround ring of FIG. 7A looking at the ring through the cutout region.

FIG. 7C is a detailed section of an edge of the substrate surround ring that includes a substrate support pin mating hole according to the principles of this invention.

FIGS. 8A is a top view of a substrate surround ring insert that mates with the substrate surround ring of FIG. 7A.

DETAILED DESCRIPTION

Figure 1A:
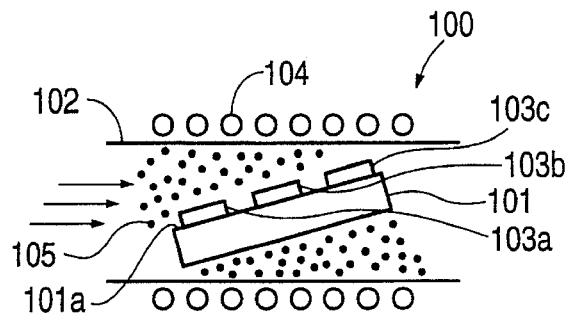
FIG. 1A is a simplified cross-sectional view of a prior art deposition reactor, known as a horizontal furnace, in which a susceptor is positioned in horizontal tube.
Figure 1B:
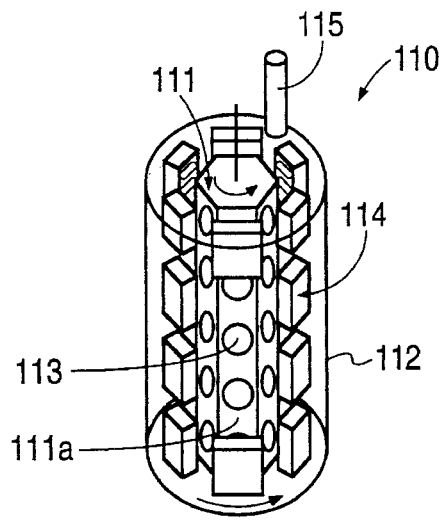
FIG. 1B is a simplified orthogonal view of another type of prior art reactor, known as a barrel reactor, in which a susceptor is suspended in the interior of a bell jar which defines the reaction chamber.
Figure 1C:
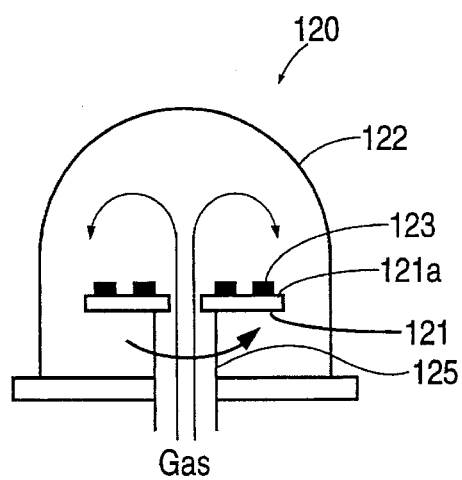
FIG. 1C is a simplified cross-sectional view of yet another type of prior art conventional chemical vapor deposition reactor, known as a pancake reactor, in which a vertically fixed susceptor is supported from the bottom of bell jar which defines the reaction chamber.
Figure 2:
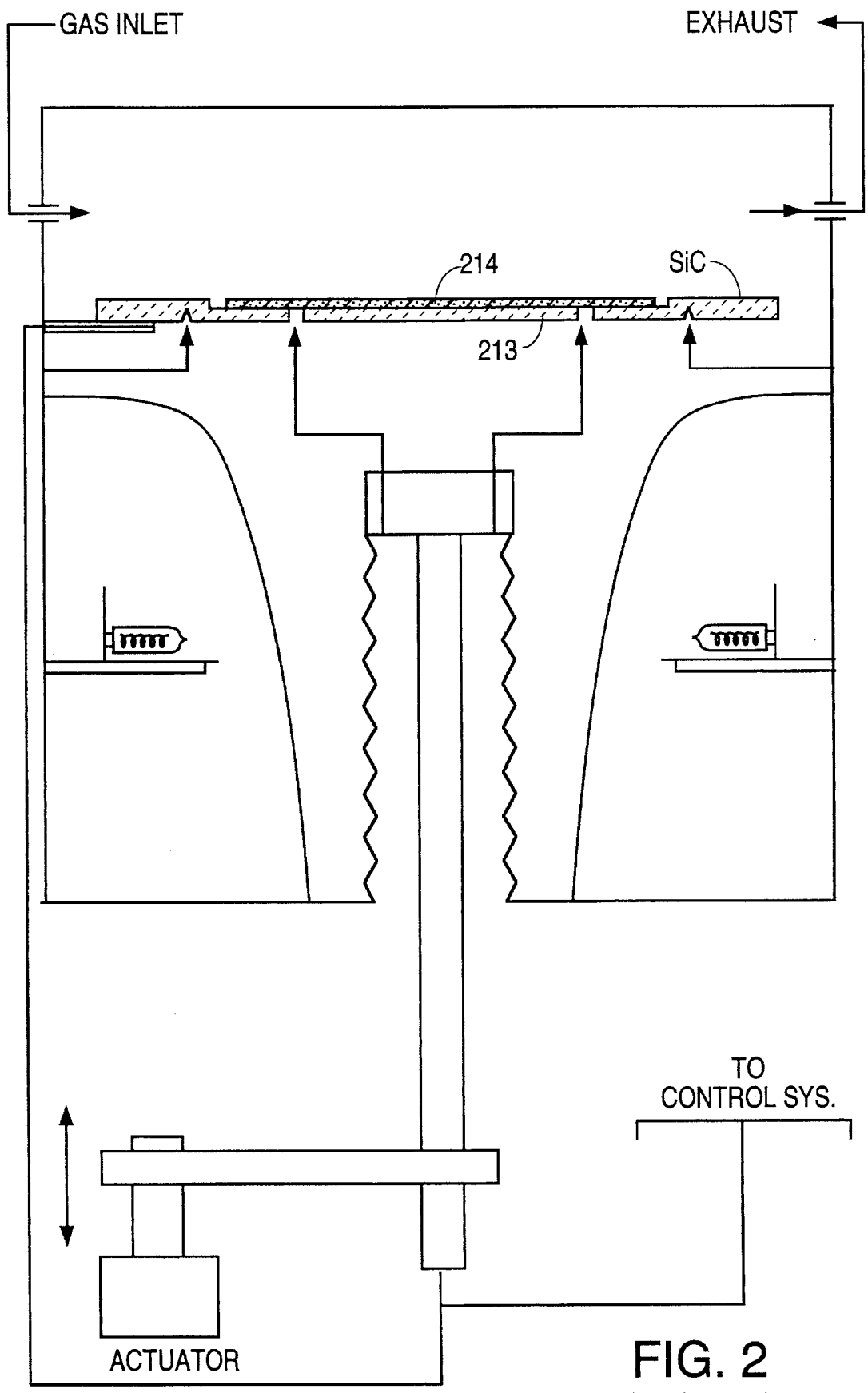
FIG. 2 is an illustration of a prior art susceptor.
Figure 3A:
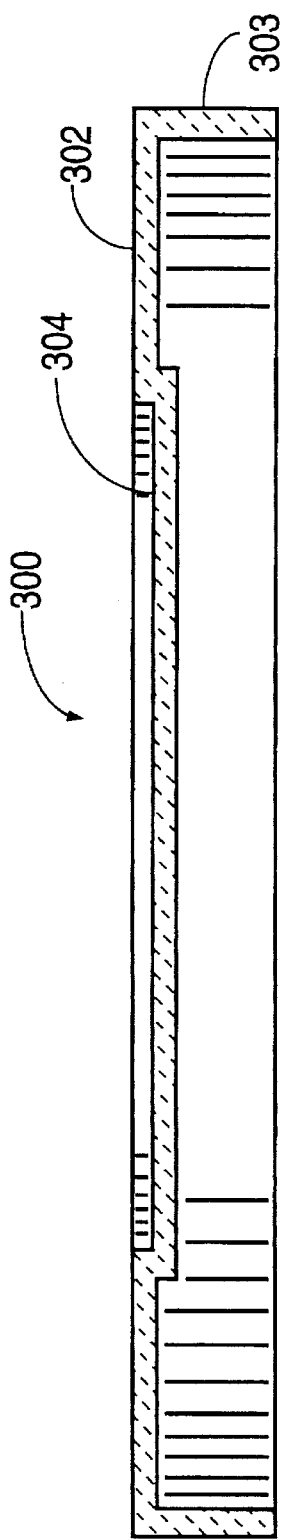
FIG. 3A is an illustration of another RTP prior art susceptor.
Figure 3B:
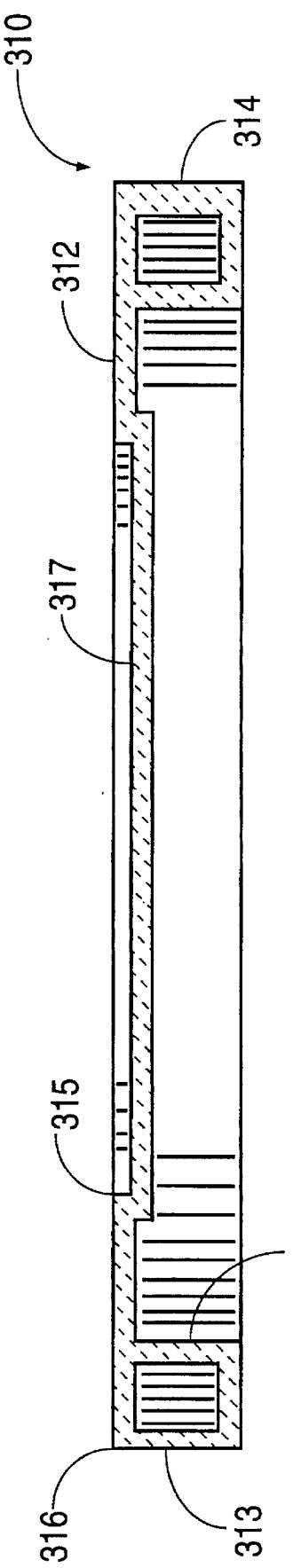
FIG. 3B is an illustration of yet another RTP prior art susceptor.

According to the principles of this invention, a novel susceptor for supporting either a single substrate, such as a semiconductor wafer or flat panel display, or a multiplicity of substrates in a rapid thermal process (RTP) reactor has a thermal mass compatible with the RTP cycle times, and the rigidity and stability required to achieve uniform coatings on the substrates.

The susceptor of this invention makes it possible not only to process a single substrate, but also a plurality of substrates in a rapid thermal process (RTP) reactor. Herein, an RTP reactor is a reactor that has a process cycle time that is short compared to the same process cycle time in a conventional reactor. The RTP reactor typically can heat the wafer or wafers at a rate between 10° C./sec and 400° C./sec. In one embodiment, the RTP reactor heats the wafer or wafers at a rate of 20° C./sec. In another embodiment, the RTP reactor heats the wafer or wafers at a rate of 10 ° C./sec. The rapid heat-up of the wafer is one of the keys to the shorter process cycle times that characterize the RTP reactor of this invention. The novel susceptor of this invention allows processing of a multiplicity of wafers or a single large wafer, e.g., 250 mm (10 inches), 300 mm (12 inches), 400 mm (16 inches) diameter wafers, using either a single or dual heat source. (Hereafter, wafer sizes will be indicated without explicitly stating that the dimension given is the diameter of the wafer.)

One RTP reactor suitable for use with this invention is described in copending and commonly assigned U.S. patent application Ser. No. 08/185,691, now pending, entitled "A RAPID THERMAL PROCESSING APPARATUS FOR PROCESSING SEMICONDUCTOR WAFERS," of Gary M. Moore, and Katsuhito Nishikawa filed on Jan. 21, 1994, and in U.S. patent application Ser. No. 08/007,981 now U.S. Pat. No. 5,444,217, entitled "A RAPID THERMAL PROCESSING APPARATUS FOR PROCESSING SEMICONDUCTOR WAFERS," of Gary M. Moore and Katsuhito Nishikawa filed on Jan. 21, 1993, both of which are incorporated herein by reference in their entirety.

Since the wafer or wafers to be processed are mounted in a recess in the susceptor, a different susceptor, or a least a different first layer of the susceptor is described more completely below, is required for each different wafer size since the number and size of the recesses are different. A different susceptor, or at least a different first layer of the susceptor is also required because a different number of wafer support pins are typically used to raise the different sizes of wafers above the main body of the susceptor. Typically, this does not present a barrier to achieving high substrate throughput since batches of a particular substrate size are normally processed one after the other, thus minimizing the number of susceptor changes that are required. In one embodiment, each susceptor is 14 inches (35.6 cm) in diameter and approximately 0.375–0.5 inches (0.95–1.27 cm) in thickness (other than at the location of the wafer recesses). In another embodiment, the susceptor is 18 inches (45.7 cm) in diameter, and in yet another embodiment, 20 inches (50.8 cm) in diameter.

The susceptor of this invention can be made of quartz or alternatively a support layer of the susceptor can be made of quartz. If the susceptor is made of quartz, the surface of the susceptor facing a radiant heat source can be bead blasted to increase heat retention. While a surface of the susceptor facing a resistance heater or passive heat distribution element is made clear by, for instance, either flame polishing or mechanical polishing, to allow more heat to pass through the susceptor to the substrate. Alternatively, either surface can be bead blasted and the other surface made clear, or a surface can be selectively bead blasted to increase heat retention at selected locations. The choice is made based on the particular heating effect desired for the RTP process in which the susceptor is used.

Maintenance of a substantially uniform temperature throughout a substrate and uniform gas flow over the surface of the substrate is essential for accurate processing of the substrate. In particular, at the edge of a substrate, the heat dissipation from the substrate to the lower temperature ambient environment within the reaction chamber may give rise to large temperature gradients at the edge which induce an undesirable phenomenon known as "slip" in epitaxial processing. Thus, there is a particular need for a means of controlling the temperature at the edge of the wafer.

Figure 4A:
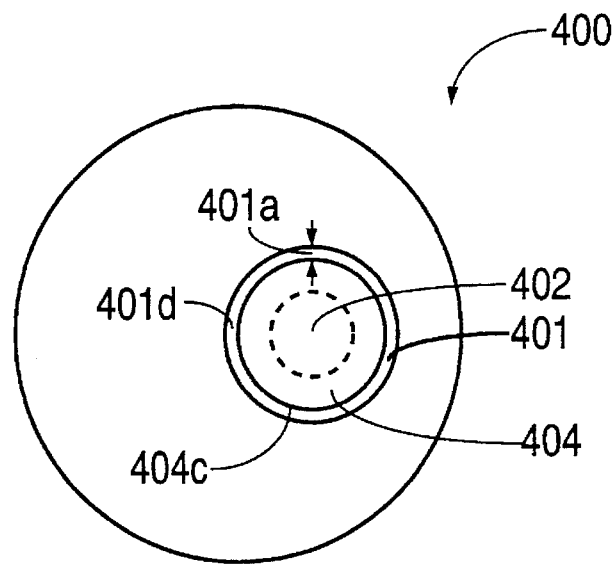
FIGS. 4A and 4B are a plan view and side view, respectively, of a wafer surround ring, spindle and wafer mounted in a pocket of a susceptor according to an embodiment of the invention.
Figure 4B:
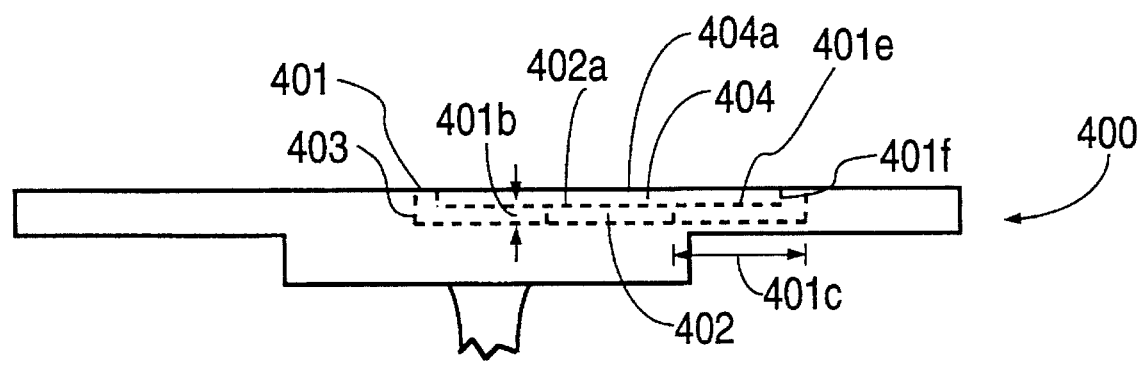

FIGS. 4A and 4B are a plan view and side view, respectively, of susceptor 400 on which wafer a surround ring 401 and a wafer 404 are mounted in a pocket 403 according to an embodiment of the invention. One function of the wafer surround ring is to help maintain a uniform temperature at the edge of the wafer.

A hole is centrally formed in a wafer surround ring 401. A recessed shelf is formed adjacent the hole and is defined by wafer edge contact surface 401f and wafer backside contact surface 401e. Wafer surround ring 401 is mounted around spindle 402 so that wafer backside contact surface 401e of wafer surround ring 401 is substantially coplanar with wafer backside contact surface 402a of spindle 402.

Spindle 402 can be formed integrally with susceptor 400 or spindle 402 can be formed as a separate piece that is dropped into pocket 403. Hereafter, in the following description of the invention, "spindle" is used to refer to an element that is centrally located within a pocket of a susceptor and that can be formed integrally with, or separately from, the susceptor. "Susceptor insert" is used to refer to an element that is centrally located within a pocket of a susceptor and that is formed separately from the susceptor. Further, as typically used herein, "spindle" denotes an element that is thicker than a "susceptor insert;" however, this need not be the case and, in some instances, a spindle and susceptor insert may have the same thickness. Generally, "spindle" and "susceptor insert" denote elements that are substantially similar, and the use of one or the other terms may encompass formation of the element separately or integrally with the susceptor, or of any thickness.

Wafer 404 is mounted on wafer backside contact surface 401e of wafer surround ring 401 and wafer backside contact surface 402a of spindle 402 such that upper surface 404a of wafer 404 is recessed slightly relative to annular upper surface 401d of wafer surround ring 401.

Wafer surround ring 401 is commercially available from Midland Materials Research of Midland, Mich. Wafer surround ring 401 is made of a material with relatively low thermal conductivity such as, for instance, graphite or silicon carbide. If graphite is used, wafer surround ring 401 is coated with silicon carbide. The silicon carbide helps minimize particle contamination, since the silicon carbide prevents migration of carbon from the graphite onto the wafer due to flaking of the graphite. The silicon carbide coating is made sufficiently thick to prevent contamination of wafer 404 with carbon flaking from the graphite.

However, for thin graphite parts that are silicon carbide coated, a CVD deposited coating of silicon carbide on one side of the part causes the part to warp. To counteract the warpage, the thickness of the CVD deposited coating on the other side of the thin graphite part is selected to eliminate the warpage and provide a flat silicon carbide coated part. Thus, the silicon carbide coating on the two sides of a thin graphite part may have different thicknesses. The exact thickness of the silicon carbide coating as well as differences in the thickness from side to side is proprietary information of Midland Materials Research.

Below, in additional embodiments of the invention, various components, e.g., the wafer surround ring, the spindle, and the susceptor insert, can be made of graphite. Where one of these components is made of graphite, it is desirable to coat the component with silicon carbide in the manner and for the reasons discussed above.

Illustratively, for susceptor 400 having a diameter of 14 inches (356 mm) and pocket 403 large enough to hold an 8 inch (200 mm) wafer, annular upper surface 401d of wafer surround ring 401 has a width 401a of 0.125 inches (3.18 mm), thickness 401b of wafer surround ring 401 underneath wafer 404 of 0.10 inches (2.54 mm) and width 401c between outer edge surface 401g and inner edge surface 401h of wafer surround ring 401 of 0.60 inches (15.2 mm). Other widths 401a, thicknesses 401b, and widths 401c can be used for other size susceptors.

Spindle 402 can be made of, for instance, graphite, silicon carbide, or quartz. Graphite and silicon carbide are desirable to provide more heat transfer to, and/or prevent heat transfer from, backside 404b of wafer 404. Quartz provides little or no heat transfer to or prevention of heat transfer from backside 404b of wafer 404. However, since heat loss is a problem mainly at edge 404c of wafer 404, the use of quartz for spindle 402, i.e., under the center of wafer 404, and graphite or silicon carbide for wafer surround ring 401, i.e., under and around edge 404c of wafer 404, may provide the desired temperature uniformity in wafer 404.

Wafer surround ring 401 (and the wafer surround rings according to additional embodiments of the invention described below) holds wafer 404 in place in pocket 403 of susceptor 400. In particular, the presence of wafer surround ring 401 about edge 404c of wafer 404 helps to maintain a temperature near edge 404c of wafer 404 that is substantially uniform with the temperature throughout the rest of wafer 404.

Figure 4C:
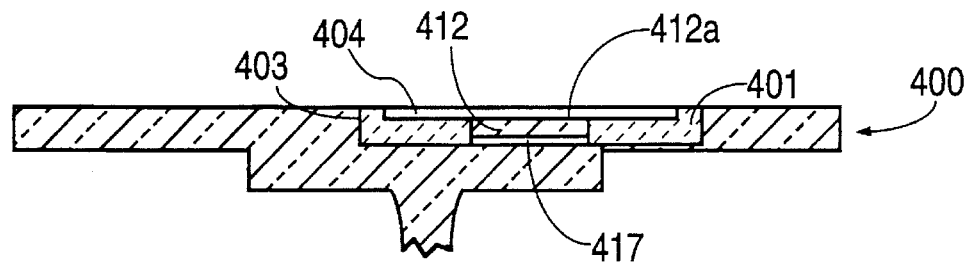
FIG. 4C is a cross-sectional view of a wafer surround ring, susceptor insert, spindle and wafer mounted in a pocket of a susceptor according to another embodiment of the invention.

FIG. 4C is a cross-sectional view of susceptor 400 on which wafer surround ring 401, susceptor insert 417, spindle 412, and wafer 404 are mounted in pocket 403 according to another embodiment of the invention. After wafer surround ring 401 is placed into pocket 403, susceptor insert 417 is placed into pocket 403 within the hole centrally formed through wafer surround ring 401. Spindle 412, which can be one to three times as thick as susceptor insert 417, is placed within the hole in wafer surround ring 401 on top of susceptor insert 417 so that wafer contact surface 412a of spindle 412 is substantially coplanar with wafer contact surface 401e of wafer surround ring 401. Wafer 404 is positioned within wafer surround ring 401 on wafer contact surface 401e of wafer surround ring 401 and wafer contact surface 412a of spindle 412.

Spindle 412 and susceptor insert 417 can be made of, for instance, quartz, silicon carbide or graphite. Typically, one of spindle 412 and susceptor insert 417 is made of quartz and the other is made of graphite or silicon carbide.

Susceptor insert 417 can be, alternatively, a rigid plate or a flexible cloth. In one embodiment of the invention, susceptor insert 417 is a graphite plate coated with silicon carbide having an overall thickness of approximately 0.125 inches (3.18 mm).

In another embodiment of the invention, susceptor insert 417 is a silicon carbide plate with a thickness between 0.0001 inches (0.0025 mm) to 0.125 inches (3.18 mm). The silicon carbide plate can be made thinner than the above-described graphite plate, since the silicon carbide plate resists bowing better than the graphite plate when the plate is subjected to the temperature extremes of the processes for which the RTP reactor is typically used. The thinner silicon carbide plate allows quicker heat up and cool down of the wafer 404. However, the graphite plate is cheaper to manufacture than the silicon carbide plate.

In yet another embodiment of the invention, susceptor insert 417 is a silicon carbide cloth. The silicon carbide cloth is cheaper to manufacture than the silicon carbide plate, but may generate more particle contamination than the plate.

Figure 4D:
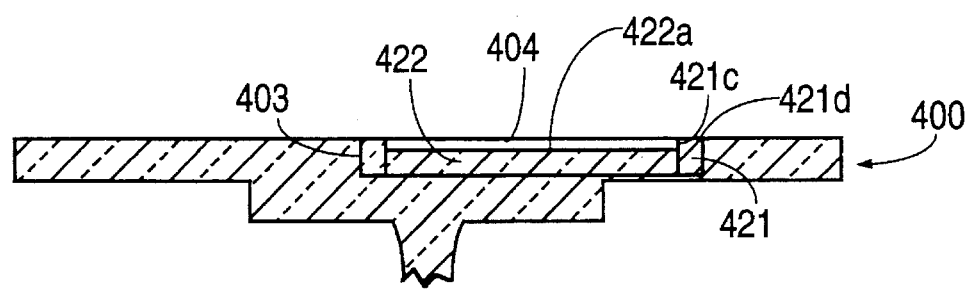
FIG. 4D is a cross-sectional view of a wafer surround ring, spindle and wafer mounted in a pocket of a susceptor according to another embodiment of the invention.

FIG. 4D is a cross-sectional view of wafer surround ring 421, spindle 422 and wafer 404 mounted in pocket 403 of susceptor 400 according to another embodiment of the invention. Wafer surround ring 421 is placed around spindle 422 in pocket 403 of susceptor 400. Unlike wafer surround ring 401 (FIGS. 4A through 4C), wafer surround ring 421 is not formed with a shelf adjacent the hole formed centrally through wafer surround ring 421. Rather, inner edge surface 421c and outer edge surface 421d of wafer surround ring 421 each extend from upper surface 421a to lower surface 421b of wafer surround ring 421. Wafer 404 is positioned on wafer backside contact surface 422a of spindle 422 and held laterally in place by contact between inner edge surface 421c of wafer surround ring 421 and edge 404c of wafer 404.

Spindle 422 can be formed integrally with susceptor 400 or spindle 422 can be formed as a separate piece and dropped into pocket 403. Spindle 422 can be made of, for instance, graphite, silicon carbide or quartz. If spindle 422 is formed integrally with susceptor 400, spindle 422 is made of the same material as susceptor 400. Wafer surround ring 421 is made of, for instance, silicon carbide or graphite.

Figure 4E:
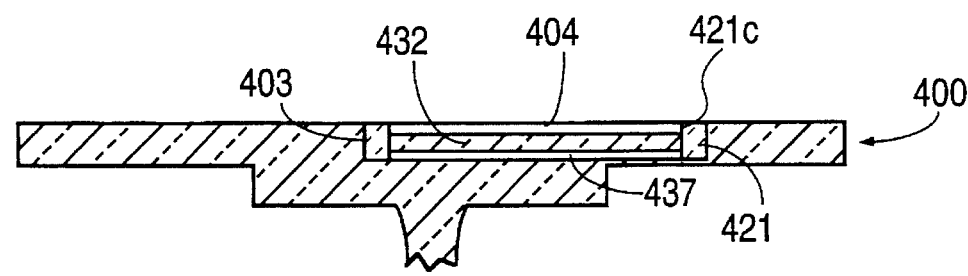
FIG. 4E is a cross-sectional view of a wafer surround ring, susceptor insert, spindle and wafer mounted in a pocket of a susceptor according to another embodiment of the invention.

FIG. 4E is a cross-sectional view of wafer surround ring 421, susceptor insert 437, spindle 432 and wafer 404 mounted in pocket 403 of susceptor 400 according to another embodiment of the invention. Wafer surround ring 421 is placed in pocket 403. Susceptor insert 437 is positioned within the hole formed through wafer surround ring 421. Spindle 432 is placed on top of susceptor insert 437 within the hole formed centrally in wafer surround ring 421. Wafer 404 is placed on wafer backside contact surface 432a of spindle 432 and laterally retained by contact between inner edge surface 421c of wafer surround ring 421 and edge 404c of wafer 404.

Wafer surround ring 421, susceptor insert 437 and spindle 432 are made of the same materials as wafer surround ring 401, susceptor insert 417 and spindle 412 (FIG. 4C). Additionally, like susceptor insert 417, susceptor insert 437 can be formed as either a flexible cloth or a rigid plate.

Figure 4F:
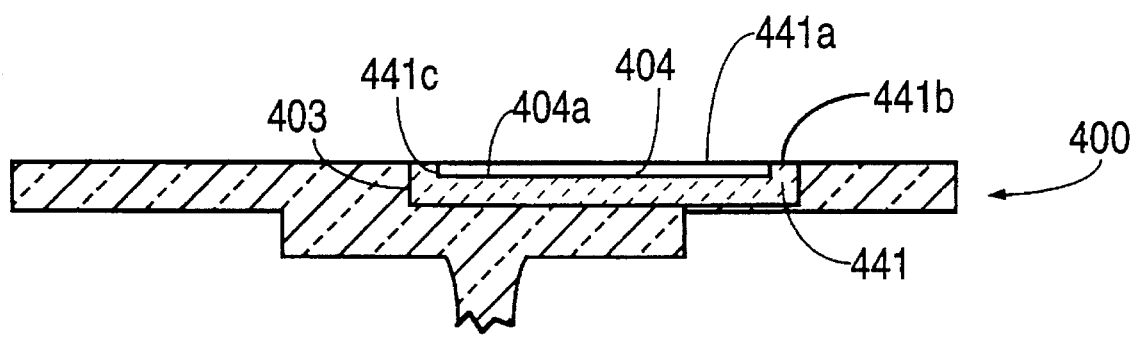
FIG. 4F is a cross-sectional view of a wafer surround ring and wafer mounted in a pocket of a susceptor according to another embodiment of the invention.

FIG. 4F is a cross-sectional view of wafer surround ring 441 and wafer 404 mounted in pocket 403 of susceptor 400 according to another embodiment of the invention. Wafer surround ring 441 is placed into pocket 403. A recess is defined in wafer surround ring 441 by wafer backside contact surface 441a and wafer edge contact surface 441b. Wafer 404 is positioned in the recess in wafer surround ring 441 so that upper surface 404a of wafer 404 is slightly below upper surface 441c of wafer surround ring 441. Wafer surround ring 441 can be made of, for instance, silicon carbide or graphite.

Figure 4G:
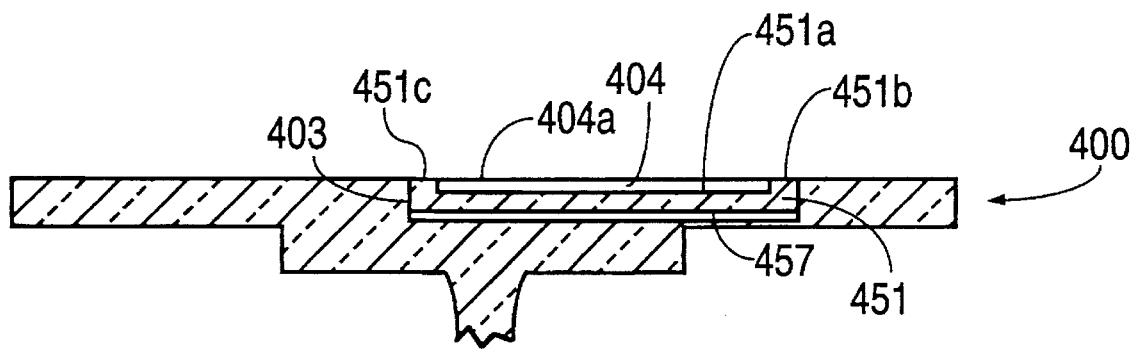
FIG. 4G is a cross-sectional view of a susceptor insert, wafer surround ring and wafer mounted in a pocket of a susceptor according to another embodiment of the invention.

FIG. 4G is a cross-sectional view of susceptor insert 457, wafer surround ring 451 and wafer 404 mounted in pocket 403 of susceptor 400 according to another embodiment of the invention. Susceptor insert 457 is positioned in pocket 403 to cover the entire bottom surface of pocket 403. Wafer surround ring 451 is placed on top of susceptor insert 457 in pocket 403. A recess is defined in wafer surround ring 451 by wafer backside contact surface 451a and wafer edge contact surface 451b. Wafer 404 is positioned in the recess in wafer surround ring 451 so that upper surface 404a of wafer 404 is slightly below upper surface 451c of wafer surround ring 441.

Wafer surround ring 451 can be made of the same material as wafer surround ring 441 (FIG. 4F). Susceptor insert 457 is made of, for instance, graphite. As above, susceptor insert 457 can be formed as either a flexible cloth or a rigid plate.

In the above embodiments of FIGS. 4A through 4G, the particular dimensions of the wafer surround ring, spindle and susceptor insert are determined empirically to minimize slip and maintain substantially uniform temperature in wafer 404. Additionally, where quartz can be used in lieu of silicon carbide or graphite, the choice is made as a result of weighing the desirable heat retention of graphite or silicon carbide against the undesirable thermal inertia of those materials. Further, where quartz is used for a spindle or wafer surround ring, the surface of the quartz can be bead-blasted or clear. Bead-blasting causes the quartz to retain more heat. Finally, though in FIGS. 4A through 4G, embodiments of the invention are described in which a single wafer is placed on the susceptor, it is to be understood that the above-described structures can be used with susceptors on which more than one wafer is mounted by placing one of the structures in each pocket into which a wafer will be placed.

Figure 4H:
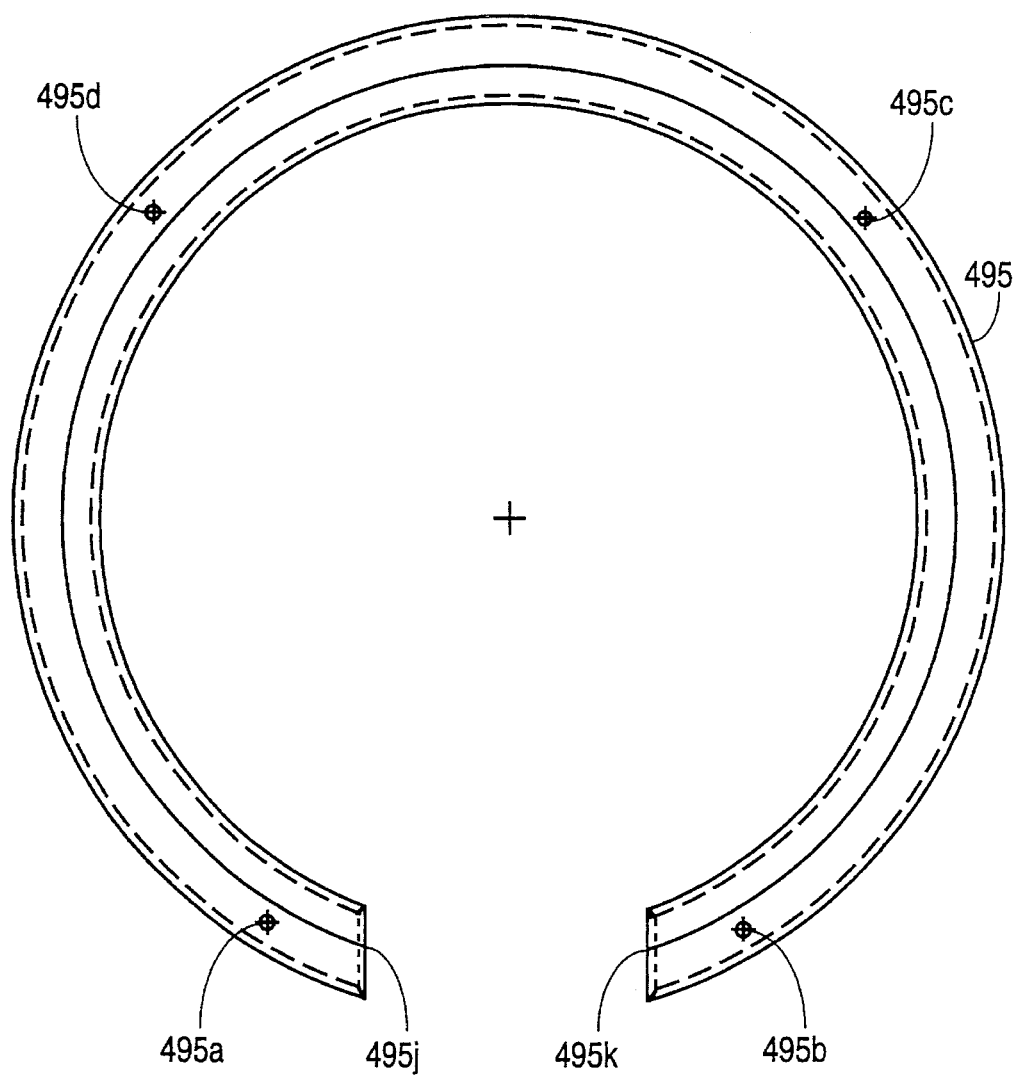
FIGS. 4H and 4I are a plan view and side cutaway view, respectively, of a C-shaped section of a wafer surround ring according to an embodiment of the invention.
Figure 4I:

FIGS. 4H and 4I are a plan view and side cutaway view, respectively, of C-shaped section 495 of a wafer surround ring according to an embodiment of the invention. The wafer surround ring according to this embodiment is formed in two parts: C-shaped section 495 and a mating section (not shown) that fits together with C-shaped section 495 to form a circular wafer surround ring. A wafer rests on wafer backside contact surface 495f which is depressed relative to upper surface 495g of the wafer surround ring. Depressions 495a, 495b, 495c, 495d are formed in susceptor contact surface 495e of C-shaped section 495.

Wafer support pins contact depressions 495a, 495b, 495c, 495d when the susceptor is lowered, thereby lifting C-shaped section 495 away from the susceptor. The wafer, which rests on wafer backside contact surface 495f, is lifted with C-shaped section 495. However, when C-shaped section 495 is lifted away, the mating section remains seated in the susceptor. Thus, an open area is left where the mating section used to be, and a robotic arm or wafer handling system can easily extend through that open area to lift and remove the wafer from C-shaped section 495.

Inner edge surface 495h and outer edge surface 495i of C-shaped section 495 are each beveled so that susceptor contact surface 495e has a smaller width than the combined width of wafer backside contact surface 495f and upper surface 495g. The sides of the pocket of the susceptor are beveled to mate with the inner edge surface 495h and outer edge surface 495i of C-shaped section 495. Beveling the interface between C-shaped section 495 and the susceptor provides good seating of C-shaped section 495 when C-shaped section 495 rests on the susceptor, so that gases cannot leak between C-shaped section 495 and the susceptor and contaminate the backside of the wafer. The beveling also enables easier installation and removal of the wafer surround ring from the susceptor. Note that the mating section has similar beveled surfaces.

Edges 495j and 495k at the open end of C-shaped section 495 are also beveled inward from wafer backside contact surface 495f and upper surface 495g to susceptor contact surface 495e. The mating section of the wafer surround ring is formed with corresponding beveled edges. Again, the beveling of the interface between C-shaped section 495 and the mating section provides good seating of C-shaped section against the mating section. The edges 495j and 495k must be beveled inward so that C-shaped section 495 does not lift the mating section when the susceptor is lowered in preparation for loading or unloading a wafer. The mating section is held in place laterally on the susceptor by pins that fit into corresponding holes formed in the mating section and in the susceptor.

In an alternative embodiment, C-shaped section 495, the sides of the pocket of the susceptor and the mating section are formed with straight edges rather than beveled edges.

Figure 4J:
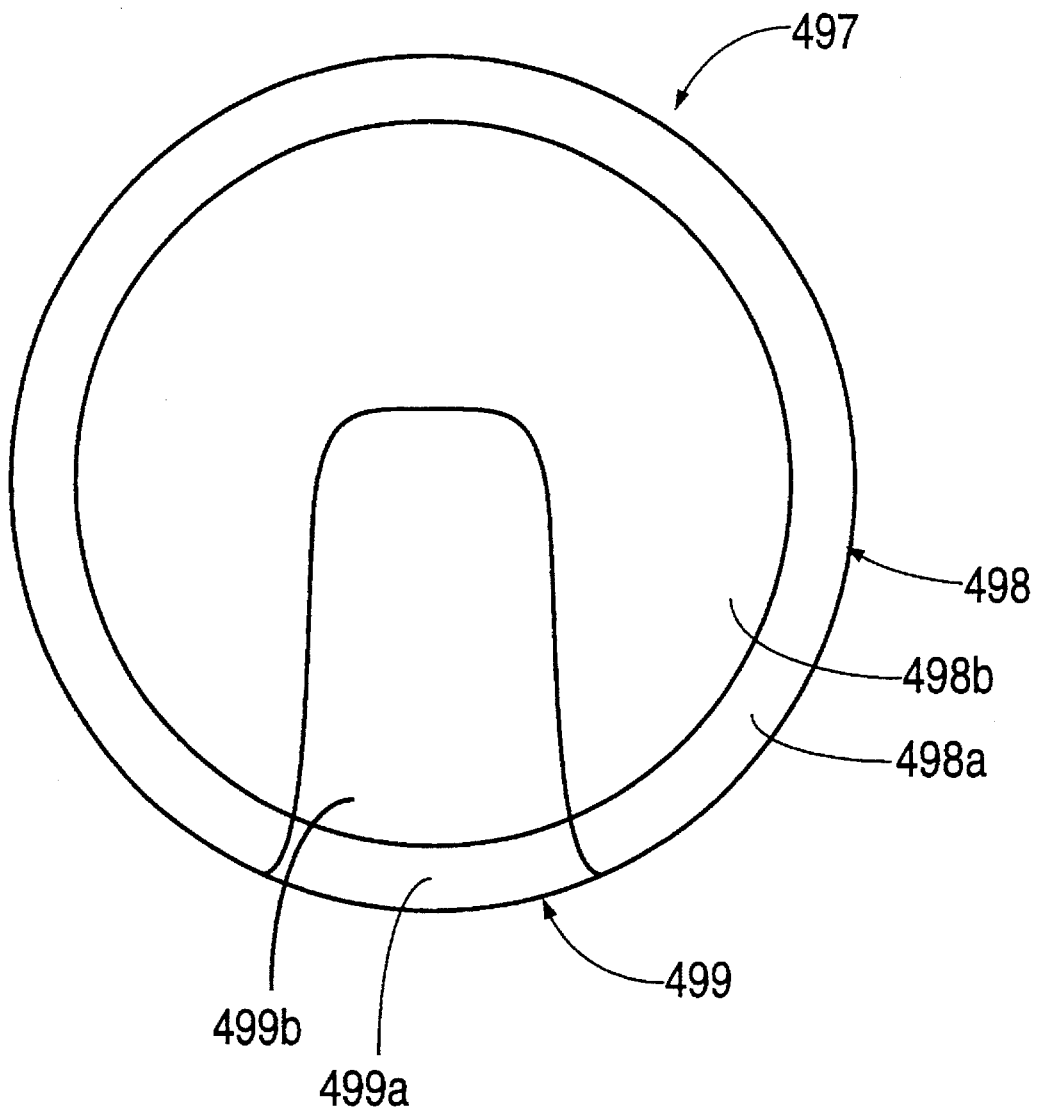
FIG. 4J is a plan view of a wafer surround ring according to another embodiment of the invention including a C-shaped section and a mating section.

FIG. 4J is a plan view of wafer surround ring 497 according to another embodiment of the invention including C-shaped section 498 and mating section 499. C-shaped section 498 includes rim 498a and floor 498b. Likewise, mating section 499 includes rim 499a and floor 498b. Wafer surround ring 497 is similar to the wafer surround ring described above with respect to FIGS. 4H and 4I, except that floors 498b and 499b extend completely underneath the wafer rather than only partly as in the wafer surround ring of FIGS. 4H and 4I. Wafer surround ring 497 can be made of the same materials as described above for the wafer surround ring of FIGS. 4H and 4I.

Figure 5A:
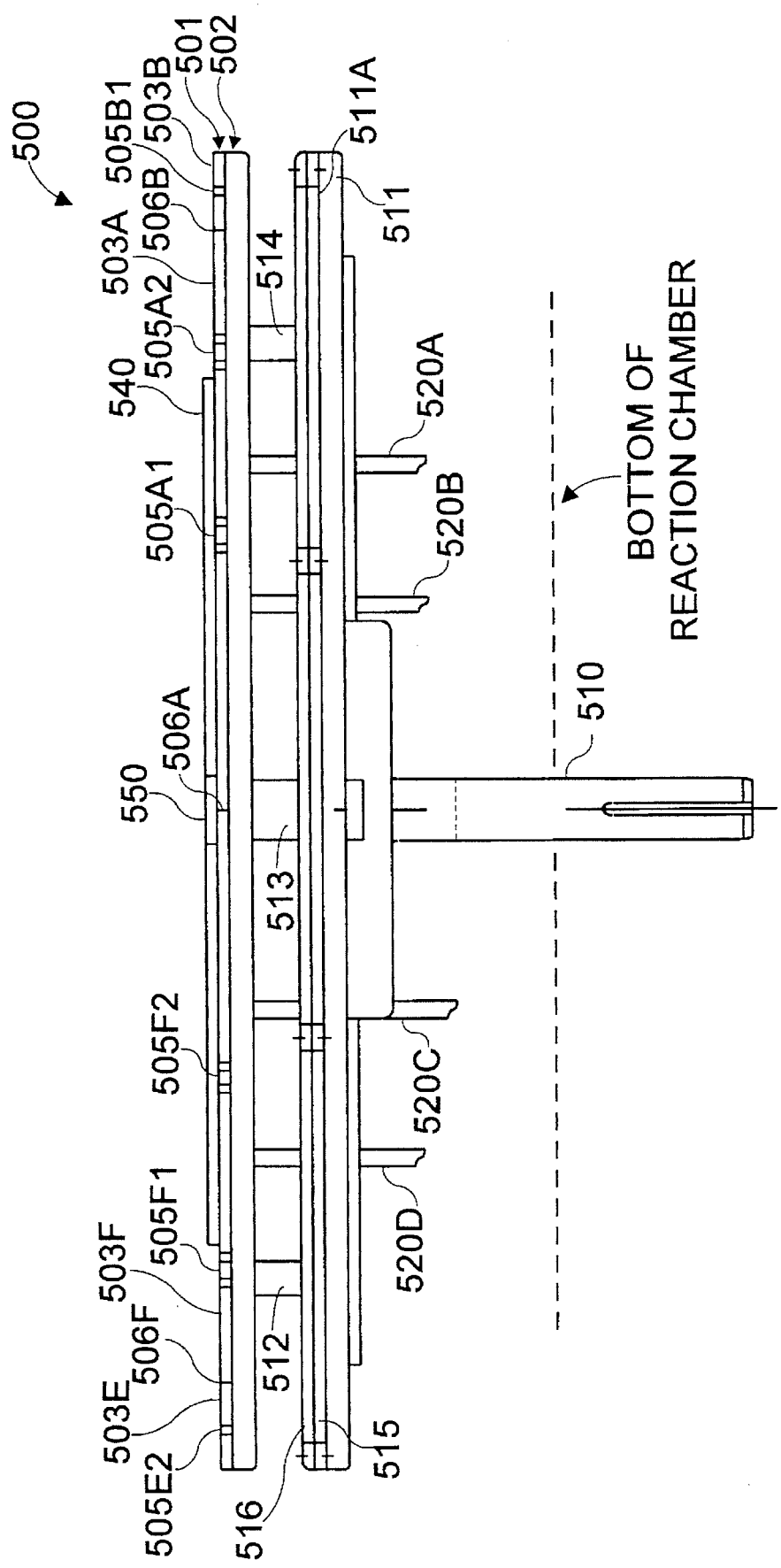
FIG. 5A is an illustration of a two layer RTP susceptor, according to the principles of this invention in a processing position.

In another embodiment of this invention, as illustrated in FIG. 5A, a novel multi-layer susceptor 500 includes a first layer 501 made up of a plurality of components that includes a substrate support ring and a substrate surround ring insert as well as a plurality of heat distribution element 503A to 503F. First layer 501 is supported by a second layer 502. The plurality of components making up first layer 501 are made from a material that has heat transfer characteristics and emissivity similar to graphite and silicon carbide. The function of first layer 501 is to minimize thermal gradients within a substrate 530 (FIG. 5B) supported by first layer 501, and to maintain a substantially uniform temperature surface surrounding substrate 530 so that process gases are not affected by temperature differentials introduced by susceptor 500.

The thickness of the plurality of components making up first layer 501 is minimized so that the thermal mass of first layer 501 does not adversely effect the RTP cycle times, but yet is sufficient to minimize thermal gradients and adverse effects on process gasses. In addition, first layer 501 is configured to minimize problems associated with either warping or cracking, as described more completely below. First layer 501 can have as large a lateral dimension as necessary because the rigidity and stability of first layer 501 is provided by second layer 502.

The material for second layer 502 is selected so that the heat energy absorbed is minimized, i.e., second layer 502 is substantially transparent to the heat energy in the RTP reactor. Consequently, second layer 502 has no effective thermal mass, but yet second layer 502 provides rigidity and support for first layer 501. However, second layer may be processed in selected regions to increase heat retention.

The combination of first layer 501 and second layer 502 results in a susceptor 500 that has the low thermal mass associated with first layer 501 and has a substantially uniform temperature distribution in the vicinity of a substrate, but yet has the stability and rigidity to support a single large substrate, or alternatively a plurality of substrates. Further, the problems with the prior art RTP susceptors with a thin inner plate and a more massive outer rim, as described above, are not encountered because each component in first layer 501 has uniform thermal mass characteristics and so heat gradients caused by differences in thermal mass within a component are not created.

In this embodiment, susceptor 500 is supported by a pedestal support shaft 510 on which is mounted a pedestal plate 511. Pedestal plate 511 includes a plurality of columns 512 to 514, three in this embodiment, that support second layer 502. A passive heat distributor 515, or alternatively a ceramic resistance heater is placed on an upper surface 511A of pedestal support plate 511 and is held in place by a plurality of pins that extend from upper surface 511A of pedestal support plate 511. A cover 516 is placed over passive heat distributor 515.

Substrate support pins 520A to 520D have a first tapered surface that forms a seal with a tapered seat in second layer 502 and a second tapered surface that fits in a corresponding tapered opening in substrate surround ring 540. As described more completely below, substrate support pins 520A to 520D are used to lift substrate surround ring 540 and consequently substrate 530 above an upper surface of layer 501 so that substrate 530 can be accessed by a substrate handling tool.

Figure 5B:
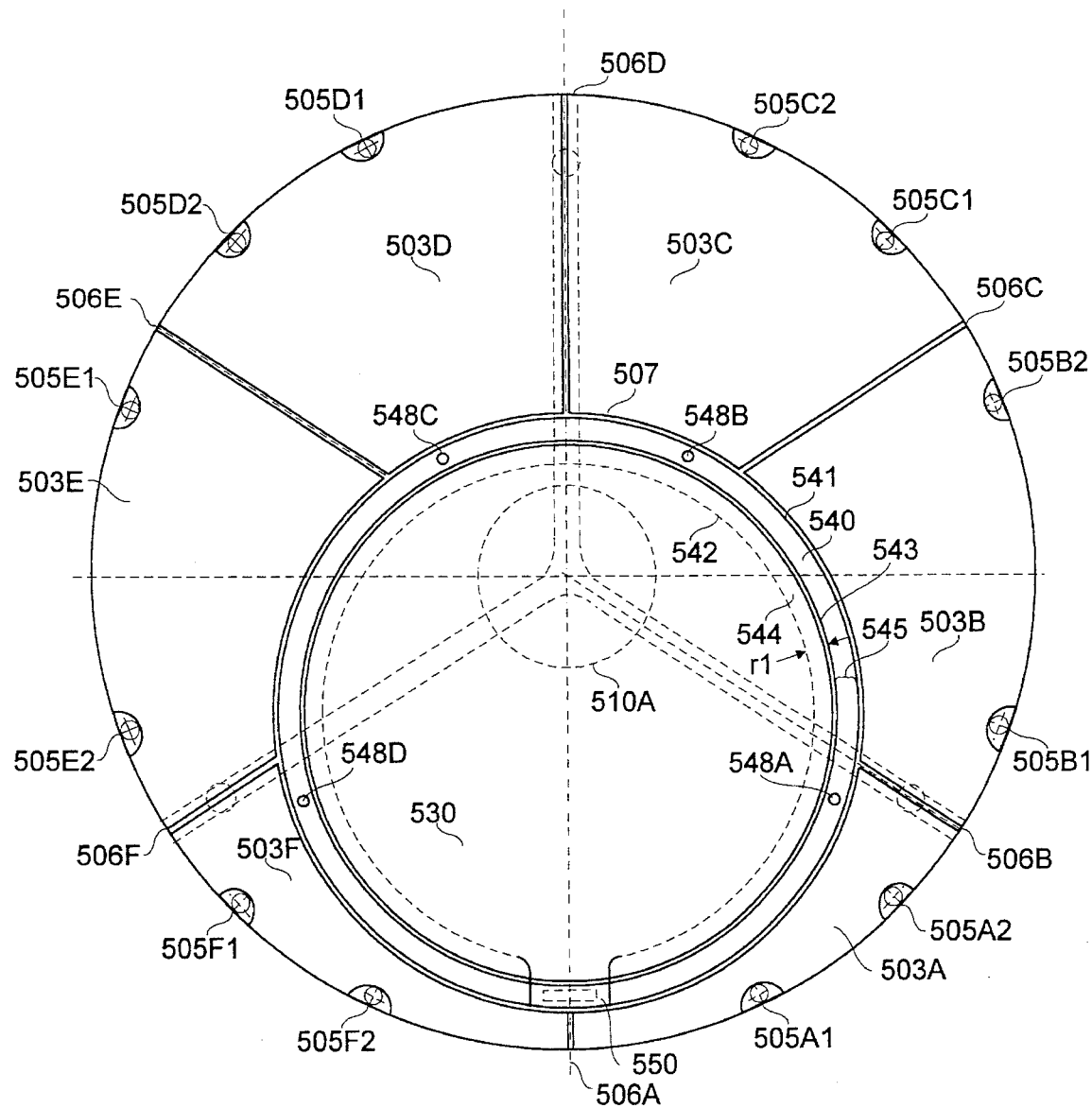
FIG. 5B is a top view of the susceptor of FIG. 5A.

FIG. 5B is a top view of susceptor 500. In this embodiment, susceptor 500 has about a twenty inch (50.8 cm) diameter. Dotted line 510A represents a circumference of a top of pedestal support shaft 510. The radial ribs on a bottom surface of pedestal support plate 511 and support columns 512 to 514 are also shown by dotted lines. Other hidden features are not shown by dotted lines for clarity.

Heat distribution elements 503A to 503F are held in position by a plurality of cylindrical pins 505A1 to 505F2, e.g., element 503A has a first circular notch about pin 505A1 and a second circular notch about pin 505A2. Pins 505A1 to 505F2 are formed about the perimeter of an upper surface 502A of layer 502. Each heat distribution element has a half circular notch in an outer circumferential edge surface that fits about a corresponding cylindrical pin.

In FIG. 5B, small gaps 506A to 506F are shown between adjacent edge surfaces of heat distribution elements 503A to 503F, respectively. Another small circumferential gap 507 between an outer circumferential edge surface 541 of substrate surround ring 540 and adjacent inner circumferential edge surfaces of heat distribution elements 503A to 503F also is shown. The size of the various gaps is selected so that at operating temperature the heat distribution elements at most just contact each other and contact substrate surround ring 540. Thus, at operating temperatures heat distribution elements 503A to 503F form a heated surface about substrate 530 so that a heated gas flow is properly maintained over substrate 530.

Substrate surround ring 540 is a cylindrical annulus with a cut-out portion so that substrate surround ring 540 has a shape similar to the shape of the letter C, as viewed in FIG. 5B. Substrate surround ring 540 has a shelf 544 about a inner circumferential edge surface 542 on which substrate 530 sits. A rim 545 of substrate surround ring 540 extends above shelf 544 and surrounds the outer circumferential edge surface of substrate 530. Inner circumferential edge surface 542 is beveled, and mates with a beveled outer circumferential edge surface of substrate surround ring insert 550.

Substrate surround ring insert 550, as explained more completely below, is substantially circular and has a height that is about the same as the height of shelf 554 so that the backside of substrate 530 also sits on an upper surface of substrate surround ring insert 550. In addition substrate surround ring insert 550 has a protrusion that extends out along a center line of substrate surround ring insert 550. A rim portion of substrate surround ring insert 550 completely fills the cut-out portion in rim 545 of substrate surround ring 540 so that when susceptor 550 is the processing position, the outer circumferential edge of substrate 530 is completely surrounded by a rim. Preferably, the distance from shelf 544 to the top of the rim is about twice the thickness of the substrate. One important aspect is that the height of the rim is selected so that during processing, the outer edge of the substrate is maintained below the top of the rim. Thus in FIG. 5A, substrate 530 is not visible.

Substrate surround ring 540 includes a plurality of holes 548A to 548D in rim 545 that extend through substrate surround ring 504. Holes 548A to 548D are tapered, as shown below, to mate with the second tapered surface of substrate support pins 520A to 520D. When susceptor 500 is lowered from the processing position, ends of substrate support pins 520A to 520D opposite to the tapered ends contact a surface in the reaction chamber of the RTP reactor, and while susceptor 500 continues to lower, substrate support pins 520A to 520D cause substrate surround ring 540 to remain stationary. Thus, substrate 530 in combination with substrate surround ring 540 is suspended above susceptor 500 as shown in FIG. 5C. Substrate surround ring insert 550 remains seated on second layer 502. Thus, in this position, a substrate handling tool can be placed under the lower surface of substrate 530 through the gap in substrate surround ring 540, and substrate 530 removed from the RTP reactor. After the substrate is removed another substrate can be positioned in substrate surround ring 540.

Figure 6:
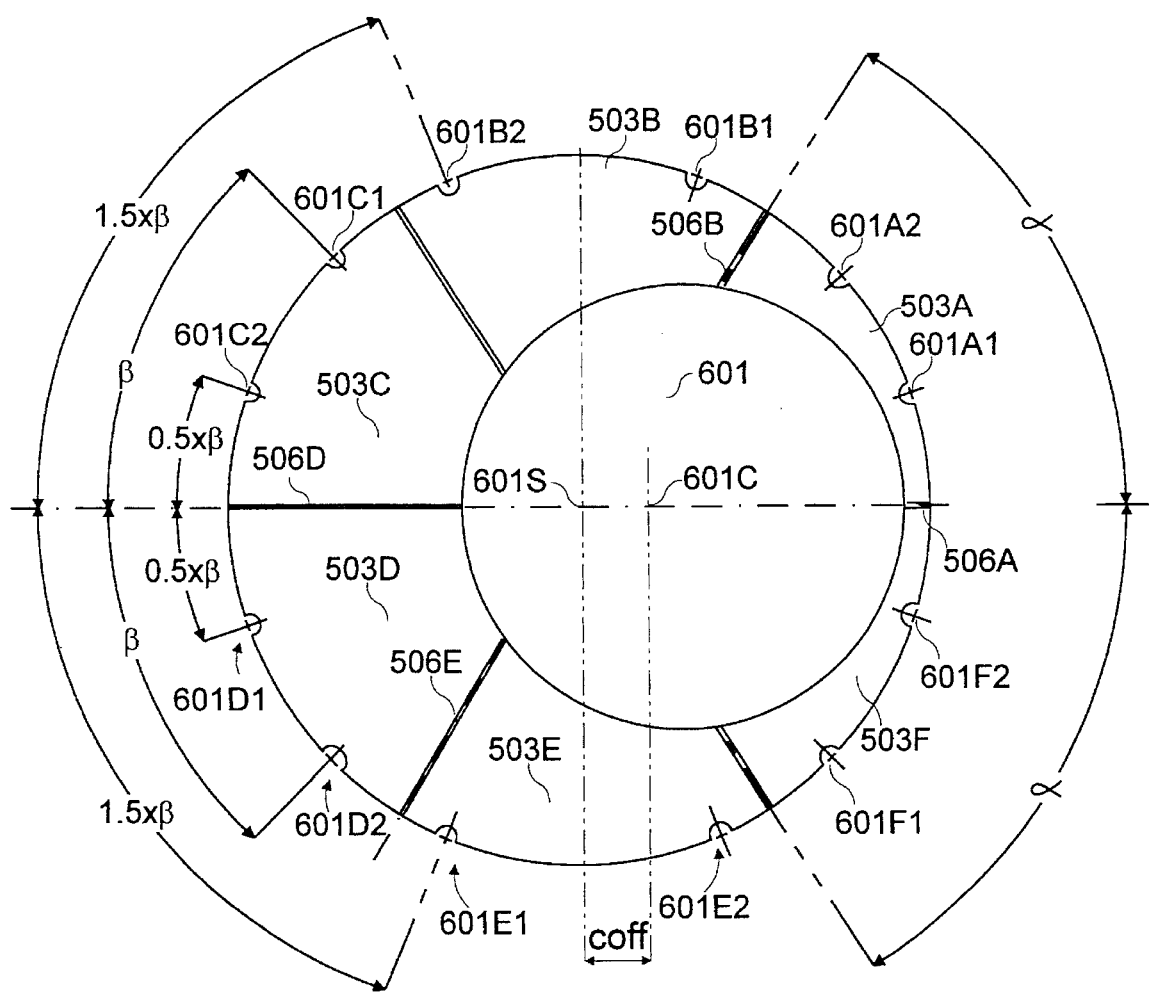
FIG. 6 is a top view of the heat distribution elements in the first layer of this invention that illustrates the shape and relative position of each element in this embodiment of the invention.

FIG. 6 shows heat distribution elements 503A to 503F, in this embodiment of the invention, in more detail. Heat distribution elements 503A to 503F are graphite coated with silicon carbide and in this embodiment, are about 0.14 inches (0.36 cm) thick. A circular cutout region 601 has a center 601C that is offset a distance COFF from center 601S of susceptor 500 along a center line 602. In this embodiment, the diameter of cutout circle 601 through center 601C is about 13.5 inches (34.3 cm). Offset distance COFF, in this embodiment, is about 2.24 inches (5.7 cm).

Heat distribution elements 503A, 503B and 503C have mirror image symmetry with heat distribution elements 503F, 503E and 503D, respectively, about center line 602. In view of the mirror image symmetry, only the locations of notches 601B2 to 601E1 are shown in FIG. 6. Each circular notch has a first center line that extends radially through center 601S and a second center line that is tangent to the outer circumferential edge surface of the heat distribution element and perpendicular to the first center line. The radius of each circular notch is about 0.28 inches (0.7 cm).

The first center lines of notches 601C1 and 601D2 each form an angle β with center line 602. The first center lines of notches 601C2 and 601D1 each form an angle β/2 with center line 602. Finally the first center lines of notches 601B2 and 601E1 form an angle 1.5*β with center line 602. In this embodiment, angle β is 45°.

Similarly, each gap 506A to 506B is centered about a radial line through center 601S of susceptor 500, and in this embodiment, each gap is about 0.1 inches (0.25 cm) in width. Gap 506A is formed by adjacent edge surfaces of heat distribution elements 503A and 503F that each extend from an outer circumferential edge surface to the inner circumferential edge surface of the heat distribution element. Gap 506B is formed by adjacent edge surfaces of heat distribution elements 503A and 503B that each extend from an outer circumferential edge surface to the inner circumferential edge surface of the heat distribution element. Gap 506C is formed by adjacent edge surfaces of heat distribution elements 503B and 503C that each extend from an outer circumferential edge surface to the inner circumferential edge surface of the heat distribution element. Gap 506D is formed by adjacent edge surfaces of heat distribution elements 503C and 503D that each extend from an outer circumferential edge surface to the inner circumferential edge surface of the heat distribution element. Gap 506E is formed by adjacent edge surfaces of heat distribution elements 503D and 503E that each extend from an outer circumferential edge surface to the inner circumferential edge surface of the heat distribution element. Gap 506F is formed by adjacent edge surfaces of heat distribution elements 503E and 503F that each extend from an outer circumferential edge surface to the inner circumferential edge surface of the heat distribution element.

The center lines of two adjacent gaps define an angle $\alpha$. In this embodiment, angle $\alpha$ is 60°. One skilled in the art will appreciate that if there were a fewer or larger number of heat distribution elements, angle $\alpha$ would be adjusted according to the number of elements. Further, while in this embodiment heat distribution elements 503A to 503F have mirror image symmetry, in other embodiments, the various components of the first layer 501 can have any geometry that facilitates manufacture and use. An important aspect of in selecting the size of the components is to select a size that minimizes bowing, warping, and cracking.

Figure 7A:
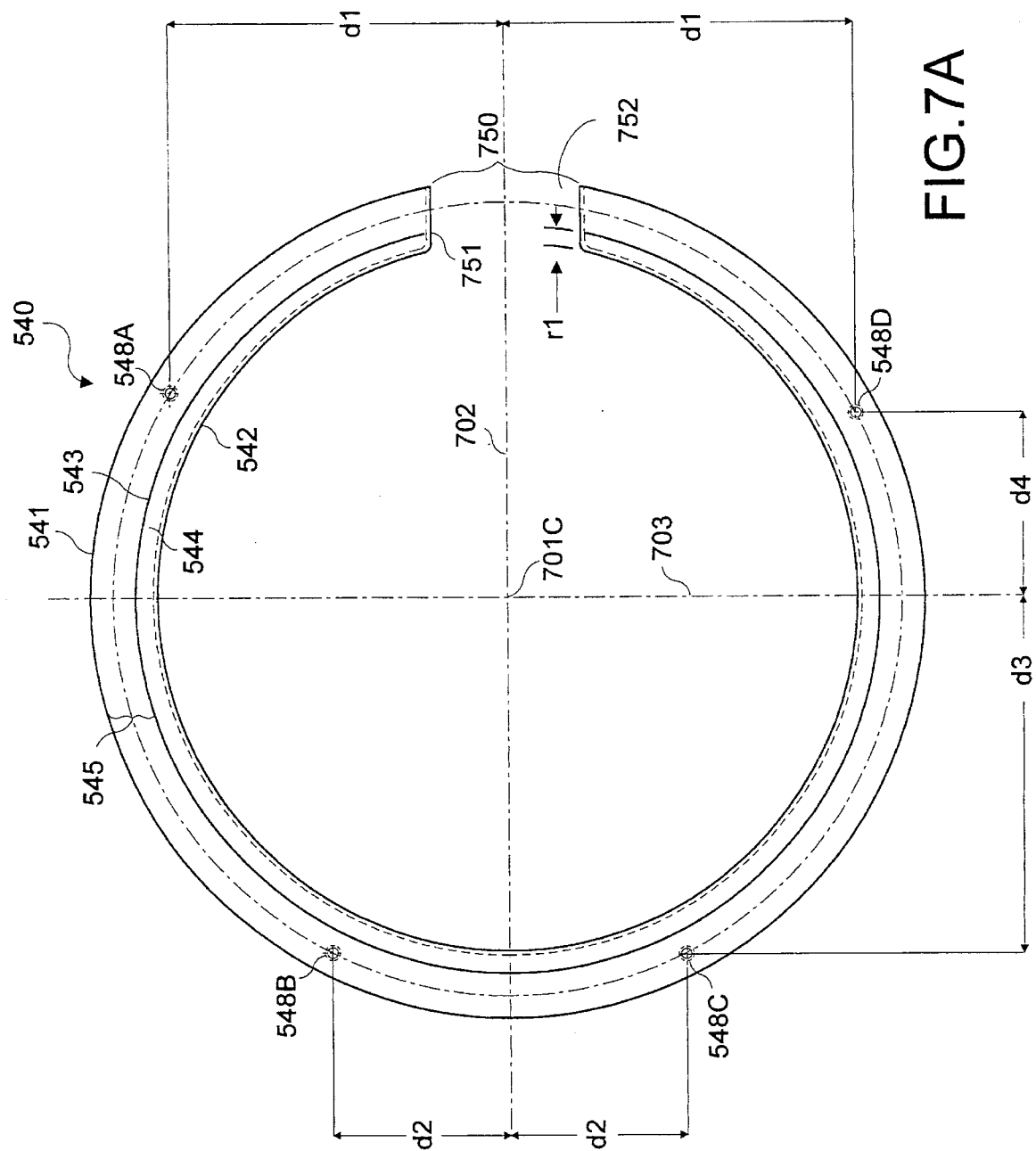
FIG. 7A is a more detailed top view of one embodiment of a substrate surround ring.

FIG. 7A is a more detailed top view of substrate surround ring 540. FIG. 7B is an end view of substrate surround ring 540 looking at the ring through cutout region 750. FIG. 7C is a detailed section of an edge of substrate surround ring 540 that includes a substrate support pin mating hole. In this embodiment, substrate surround ring 540 is made of silicon carbide.

In FIG. 7A, substrate surround ring 540 has a center 701C. When substrate surround ring 701C is placed on surface 502, center 701C is coincident with center 601C. Inner circumferential edge surface 542 of substrate surround ring 540 has a diameter of about 11.35 inches (28.83 cm). A circle defined by inner circumferential edge surface 543 of rim 545 has a diameter of about 11.95 inches (30.35 cm) so that distance R1 is about 0.60 inches (1.52 cm).

The position of inner circumferential edge surface 543 of rim 545 is important for epitaxial processing. If the gap between the substrate and edge surface 543, sometime referred to as wall 543, is too great, slip occurs. Thus, wall 543 is positioned as close as possible to the substrate edge to minimize heat loss from the substrate edge. Specifically, the diameter of wall 543 is made as close to the substrate diameter as possible, but when a substrate is placed in substrate surround ring 540, the substrate must rest entirely on shelf 544 and not contact wall 543. The gap between the substrate edge and wall 543 is the range of about 0.05 inches (0.13 cm) to 0.2 inches (0.51 cm) and in one embodiment is about 0.0625 inches (0.16 cm). Similarly, width R1 of shelf 544 can be varied to minimize any effects of the interface between substrate surround ring 540 and substrate surround ring insert 550.

Inner circumferential edge surface 542 has a bevel that is defined by angle $\beta 1$ in FIG. 7C. In this embodiment, angle $\beta 1$ is about 15°.

Substrate pin support holes 548A through 548D are located on a center line of rim 545. Holes 548A and 548D are centered a distance d1 from center line 702 of substrate surround ring 540. In this embodiment distance d1 is about 5.5 inches (13.97 cm). Opening 750 from one end 751 of ring 540 to another end 752 of ring 540 is about 2.04 inches (5.18 cm). Thus, substrate surround ring 540 has first and second ends 751, 752 separated by a gap 750 so that said substrate surround ring 540 has as a shape similar to the letter C. Substrate support pin holes 540A and 540D are also centered about distance d4 from center line 703. Distance d4, in this embodiment, is about 3.2 inches (8.13 cm).

Substrate support pin holes 548B and 548C are centered a distance d2 from center line 702 and a distance d3 from center line 703. In this embodiment, distance d2 is 3.0 inches (7.62 cm) and distance d3 is 5.63 inches (14.3 cm). The diameter of outer circumferential edge surface 541 is about 13.3 inches (33.78 cm). The thickness of substrate surround ring at outer circumferential edge surface 541 is about 0.25 inches (0.64 cm) and the thickness at inner circumferential edge surface 542 is about 0.20 inches (0.51 cm). Thus, shelf 542 has a depth of about 0.05 inches (0.13 cm) from the top of rim 545, i.e., the height of wall 543 is about 0.05 inches (0.13 cm), as shown in FIG. 7B by the vertical dotted line.

FIG. 7C is a cutaway view that shows the geometry for the substrate support pin holes in substrate surround ring 540. The holes extend through substrate surround ring in rim 545 and have a taper that defines an angle $\beta 2$ that is about 20°.

Figure 8B:
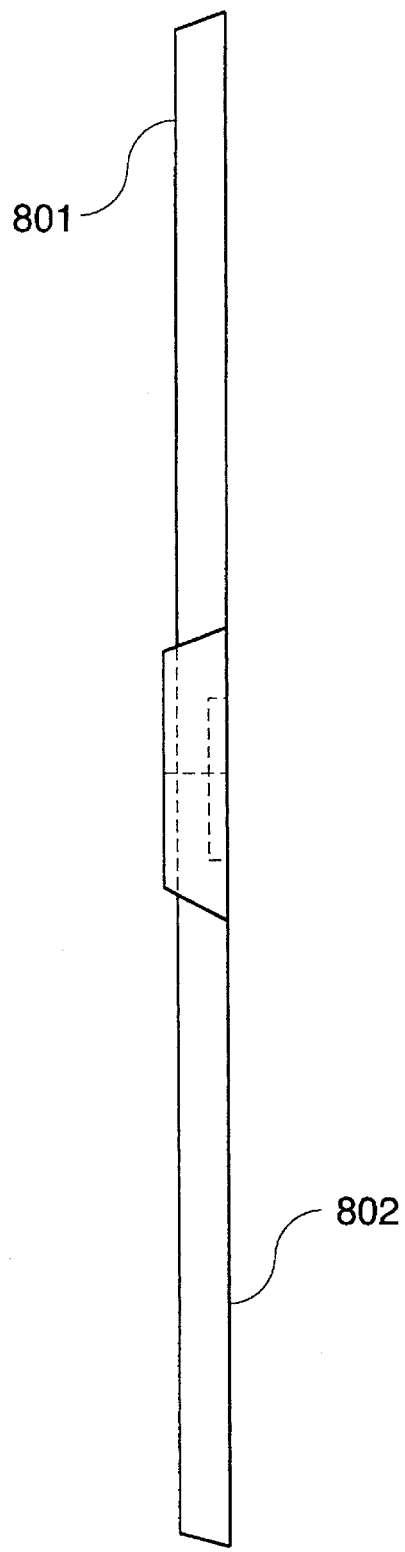
FIG. 8B is a side view of the substrate surround ring insert of FIG. 8A.
Figure 8C:
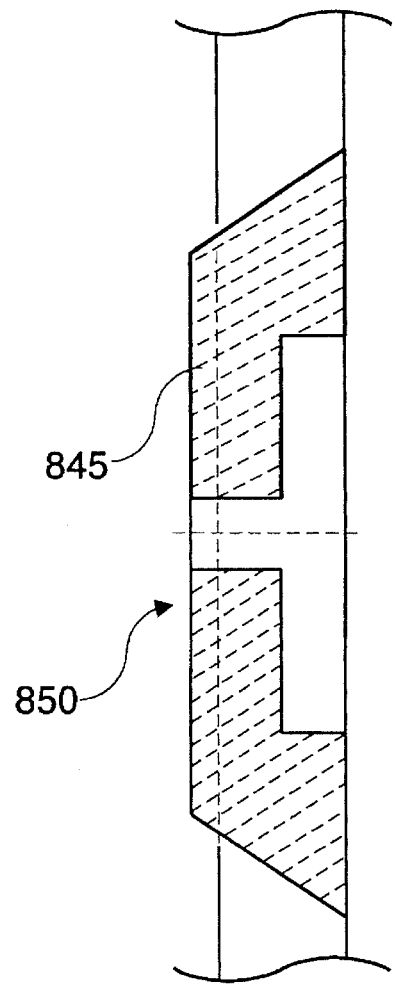
FIG. 8C is a cutaway view of the protrusion of the substrate surround ring insert of FIGS. 8A and 8B.

FIGS. 8A is a top view of substrate surround ring insert 550 that mates with substrate surround ring 540. FIG. 8B is a side view of substrate surround ring insert 550, and FIG. 8C is a cutaway view of protrusion 850 of substrate surround ring insert 550.

Substrate surround ring insert 550 has an outer circumferential diameter at upper surface 801 of 11.3 inches (28.7 cm) and at lower surface 802 of 11.4 inches (28.96 cm) so as to mate with the beveled inner circumferential edge surface 542 of substrate surround ring 540. In this embodiment, substrate surround ring insert 550 is made of 0.2 inch (0.51 cm) thick silicon carbide.

Along center line 803, protrusion 850 has a shelf and rim portion that has the same geometry as shelf 544 and rim 545 of substrate surround ring 540 and fills gap 750 of substrate surround ring 540. View 8C shows a slot within rim portion 845 of substrate surround ring insert 550 that mates with a lip on surface 502 so as to hold substrate surround ring insert 550 in position.

Figure 9A:
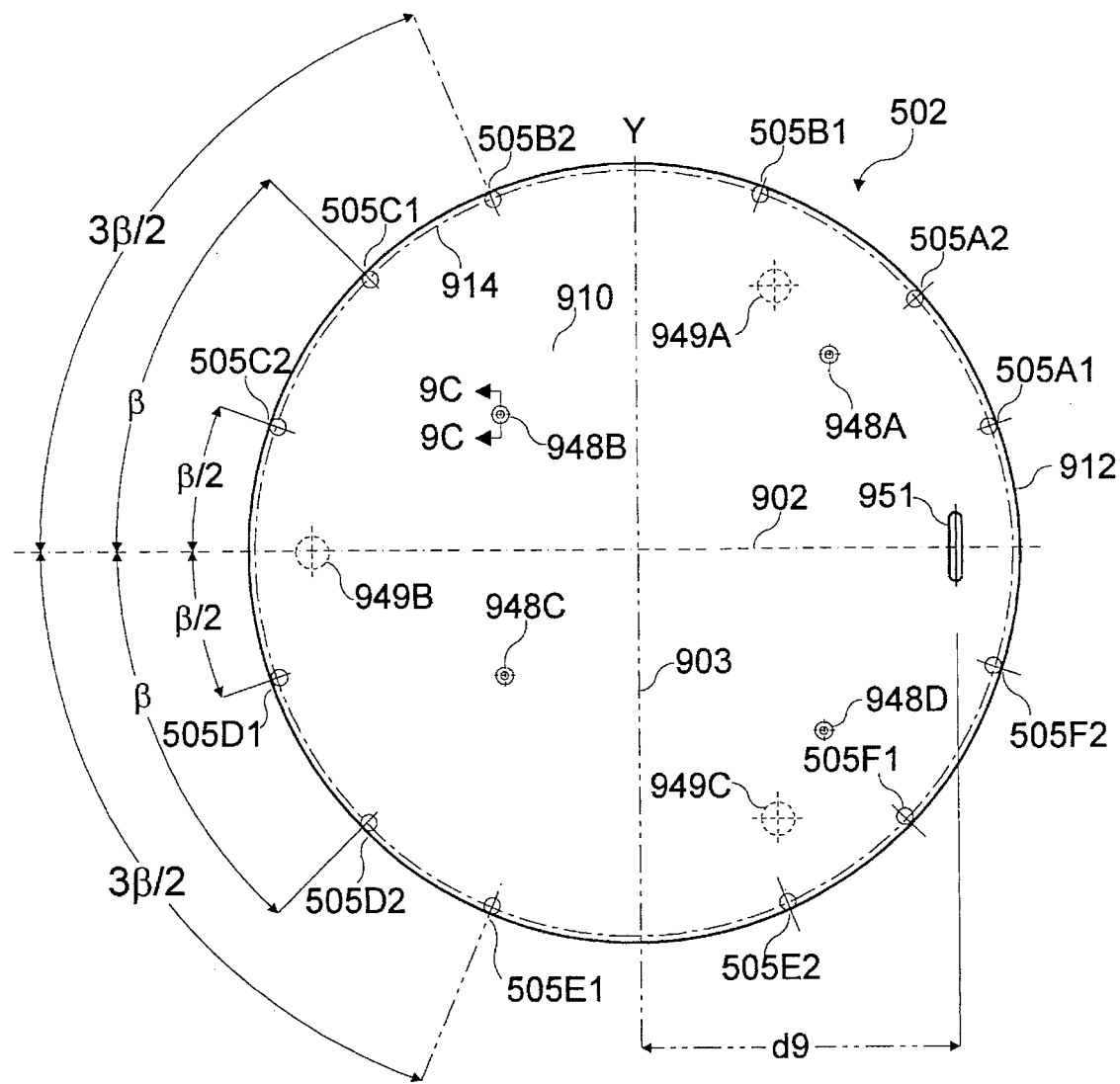
FIG. 9A is a top view of the second layer of the susceptor of this invention.
Figure 9B:
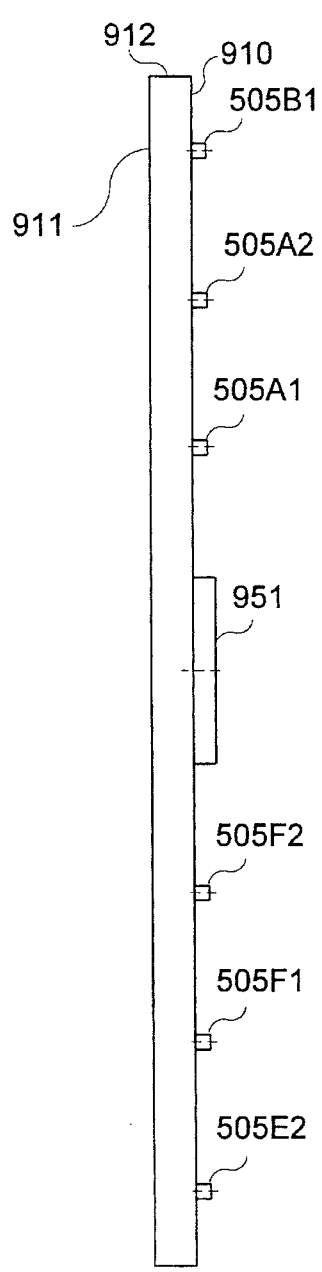
FIG. 9B is a side view of the second layer of FIG. 9A.
Figure 9C:
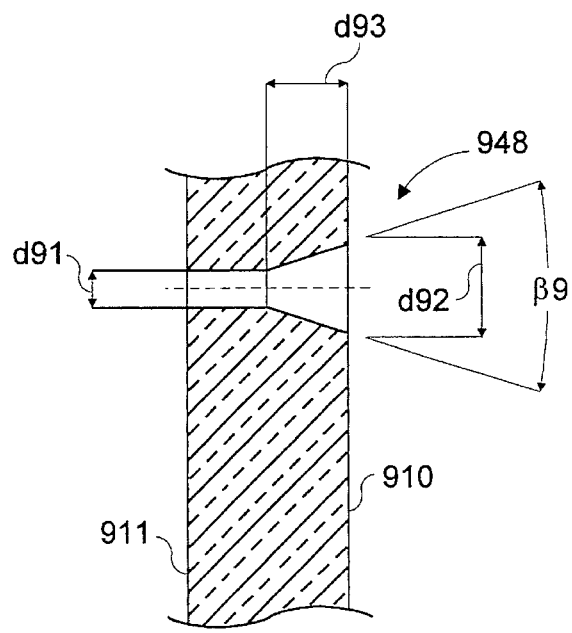
FIGS. 9C and 9D are cross-sectional views of the substrate support pin holes and cylinder recesses in the second layer of the susceptor.
Figure 9D:
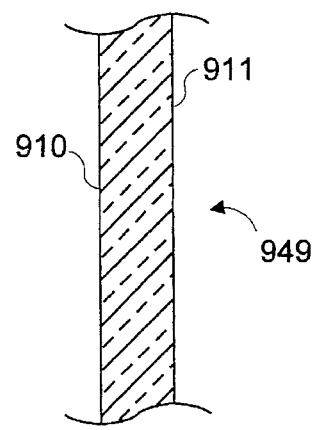

FIG. 9A is a top view of layer 502 of susceptor 500. FIG. 9B is a side view of layer 502. FIG. 9C is a cross-sectional view of substrate support pin holes 948A to 948D. FIG. 9D is a cross-sectional view that illustrates the recesses 949A to 949C in bottom surface 911 of layer 502 that receive columns 512 to 513.

Figure 11:
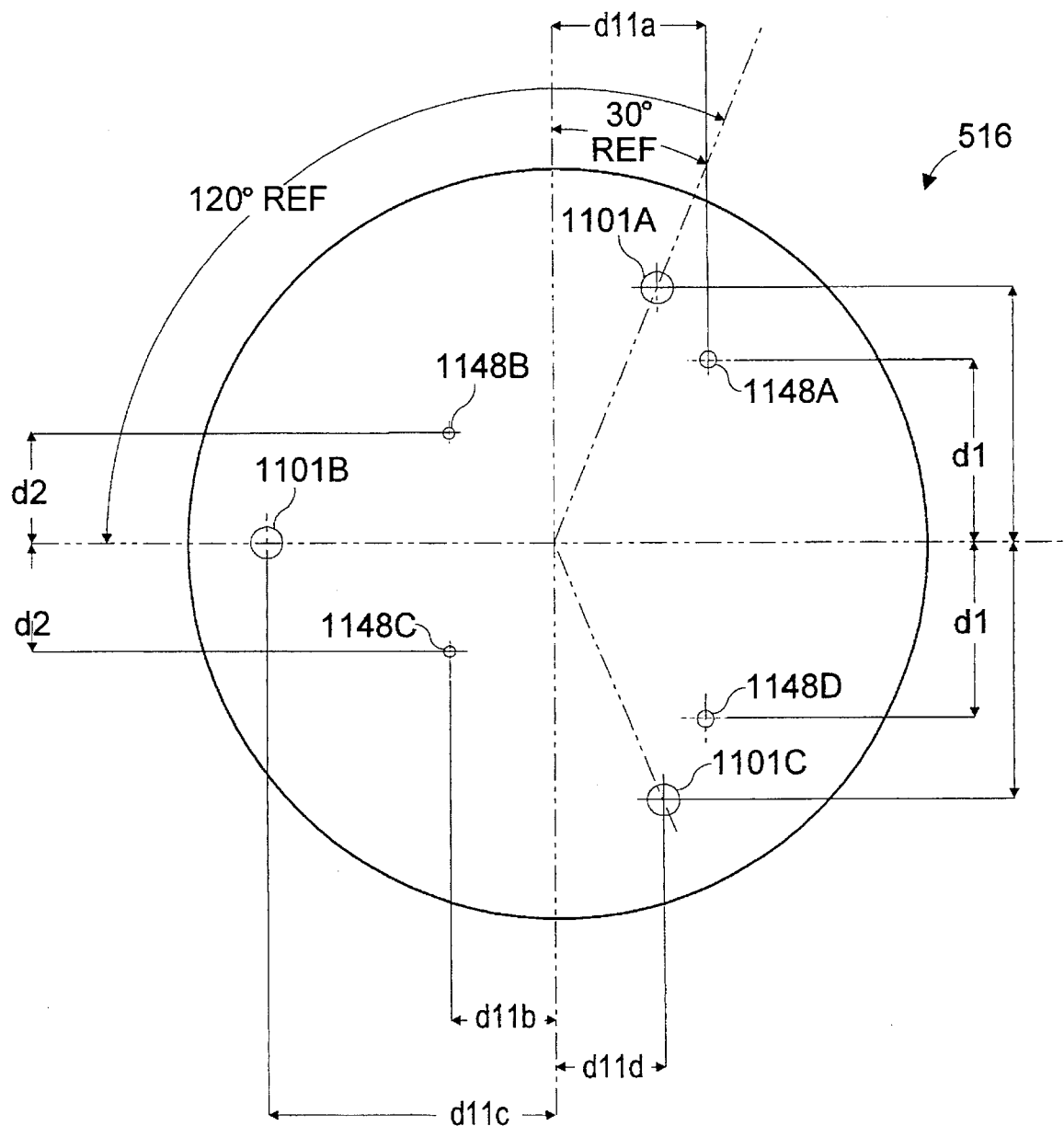
FIG. 11 is a top view of a cover for the passive heat distributor used with one embodiment of the two layer susceptor of this invention.

In this embodiment, layer 502 is made of clear quartz, and top surface 910 and bottom surface 911 are fire polished. Outer circumferential edge surface 912 is bead-blasted. In another embodiment, the area under a substrate surround ring can be bead-blasted. In this embodiment, layer 502 has a diameter of about 20 inches (50.8 cm) and a thickness of 0.437 inches (1.11 cm). The location of the substrate support pin holes 948A to 948D is the same as substrate support pin holes 1148A to 1148D, respectively, as illustrated in FIG. 11. However, if layer 502 is used with multiple first layers 501, layer 502 has a set of substrate support pin holes for each substrate surround ring mounted on layer 502.

Center line 914 through each of twelve pins 505A1 to 505F2 has a diameter of 19.75 inches (50.17 cm) in this embodiment and so pins 505A1 to 505F2 are adjacent to outer circumferential edge surface 912. Each pin has a height of about 0.14 inches (0.36 cm) and a diameter of about 0.24 inches (0.61 cm).

Layer 502 has a lip 951 on upper surface 910 that is positioned to engage the corresponding recess in the lower surface of rim portion 845 of substrate surround ring insert 550. Lip 951 is perpendicular to center line 902 and symmetric about center line 902. Lip 951 is positioned on center line 902 a distance d9 from centerline 903, which in this embodiment is about 8.5 inches (21.59 cm).

FIG. 9C is a cutaway view of each of substrate support pin holes 948A to 948D. Each hole has a diameter d91 in bottom surface 911 and a diameter d92 in top surface 910. The diameter of the hole in top surface 910 tapers down and intersects the diameter of the hole in bottom surface 911 at a distance d93 into layer 502. The exact taper used is selected to form a seal, when susceptor 500 is in the processing position, with a corresponding taper on the substrate support pin that extends through the hole. In this embodiment, distance d91 is about 0.2 inches (0.51 cm); distance d92 is about 0.3 inches (0.76 cm); distance d93 is about 0.23 inches (0.58 cm); and angle β9 is about 30°. In this embodiment, layer 502 has a thickness of about 0.44 inches (1.12 cm) and lip 951 has a height of 0.08 inches (0.20 cm). In FIG. 9D, recess 949 has a depth of 0.125 inches (0.32 cm).

Figure 10:
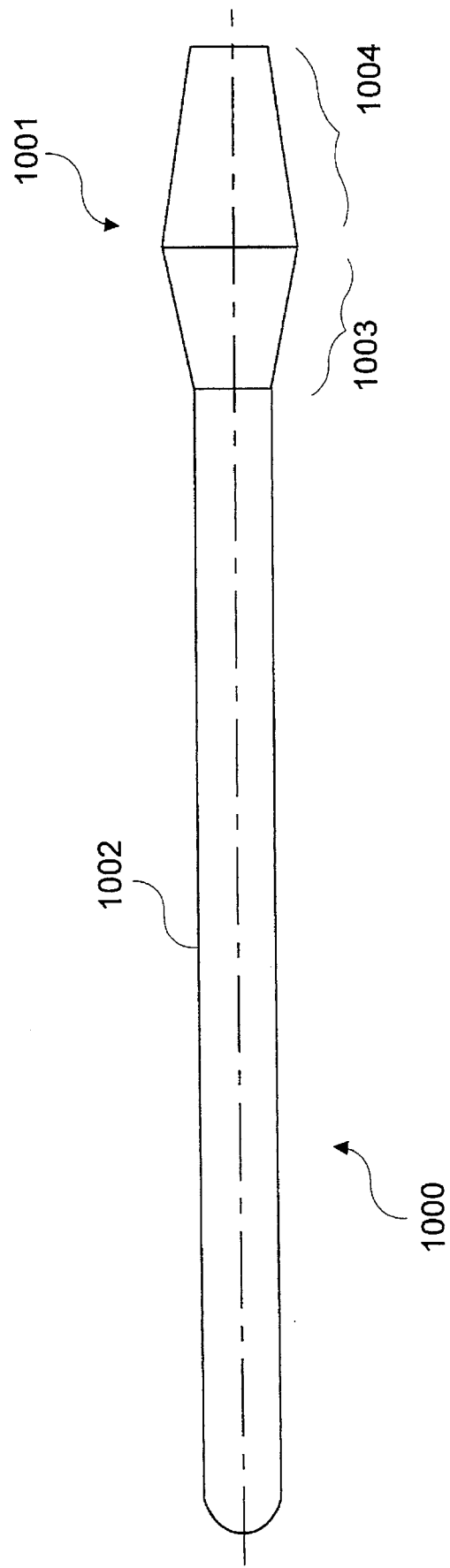
FIG. 10 is an illustration of a substrate support pin for use with the two layer susceptor of this invention.

Pin 1000 (FIG. 10) is a diagram of each of substrate support pins 520A to 520D. Pin 1000 has a total length of 3.25 inches (8.26 cm) and has a diameter of 0.125 inches (0.32 cm) except at tapered end. Cylindrical body 1002 transitions to a first tapered region 1003 that extends out from body 1002. First tapered region 1003 transitions into a second tapered region 1004 that tapers back to the original diameter.

FIG. 11 is a top view of cover 516. In this embodiment cover 516 is made of clear fire polished quartz that is 0.13 inches thick (0.33 cm) and has a 20 inch (50.8 cm) diameter. Holes 1101A to 1101C have a diameter of 0.75 inches (1.91 cm) and substrate support pin holes 1148A to 1148D have a diameter of 0.38 inches (0.97 cm). Distances d1 and d2 are the same as those in FIG. 7A. The other distances are given in Table 1 below for this embodiment.

TABLE 1

| Dimension | Inches |
| --- | --- |
| d11a | 5.43 (13.97 cm) |
| d11b | 3.39 (8.61 cm) |
| d11c | 8.50 (21.59 cm) |
| d11d | 4.25 (10.80 cm) |

Figure 12:
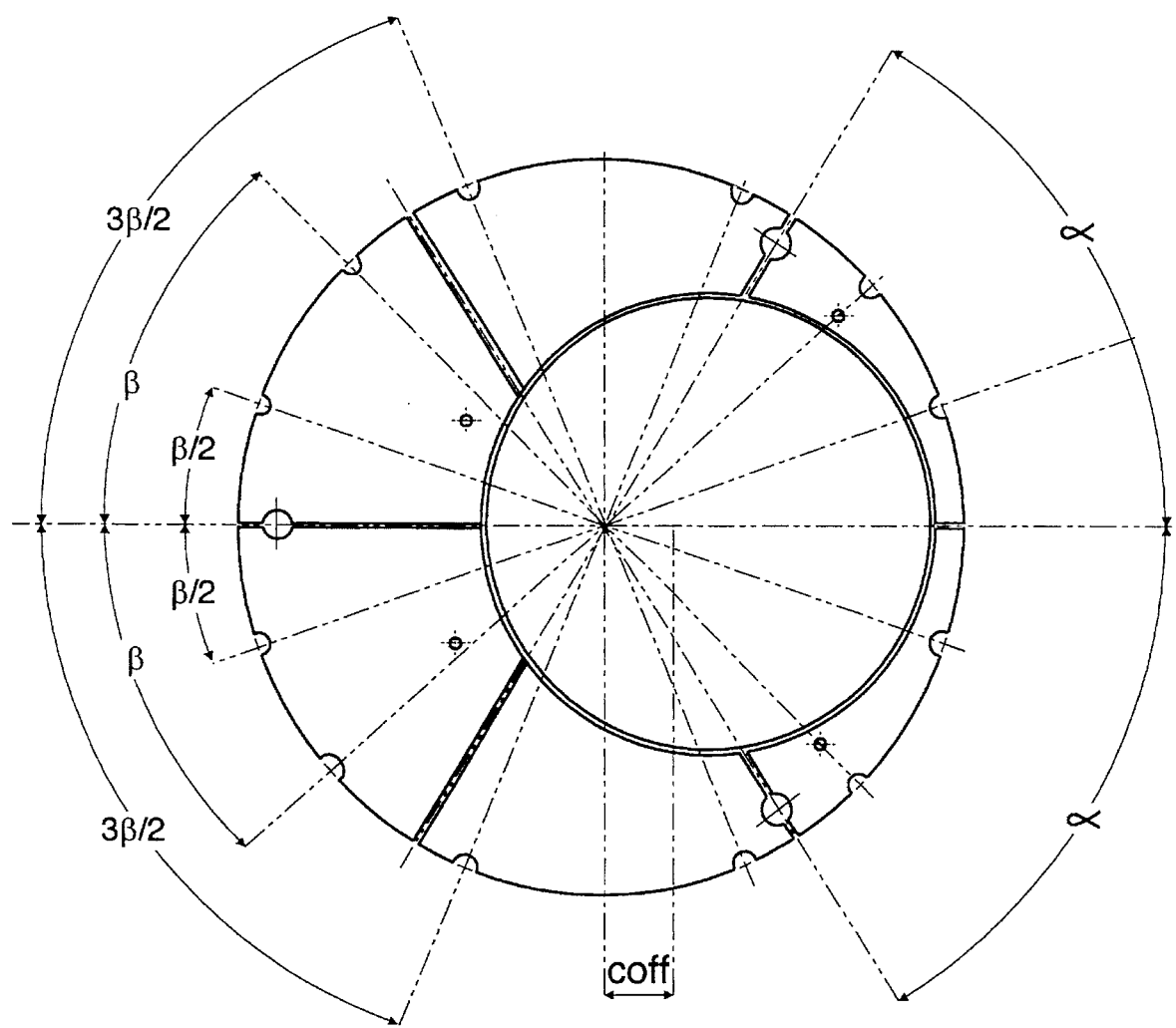
FIG. 12 is a more detailed diagram of the passive heat distributor used with one embodiment of the two layer susceptor of this invention.

FIG. 12 is a more detailed diagram of passive heat distributor 515 that is made of silicon carbide coated graphite. Element 515 has a geometry that is similar to heat distribution elements except element 515 includes holes for columns 512 to 514. The positions of the holes in element 515 are the same as the positions of the holes in cover 516. The circular portion has a diameter of 11.5 inches (29.21 cm). The various angles and gap sizes are the same as for the heat distribution elements in FIG. 6, and that description is incorporated herein by reference.

Figure 13A:
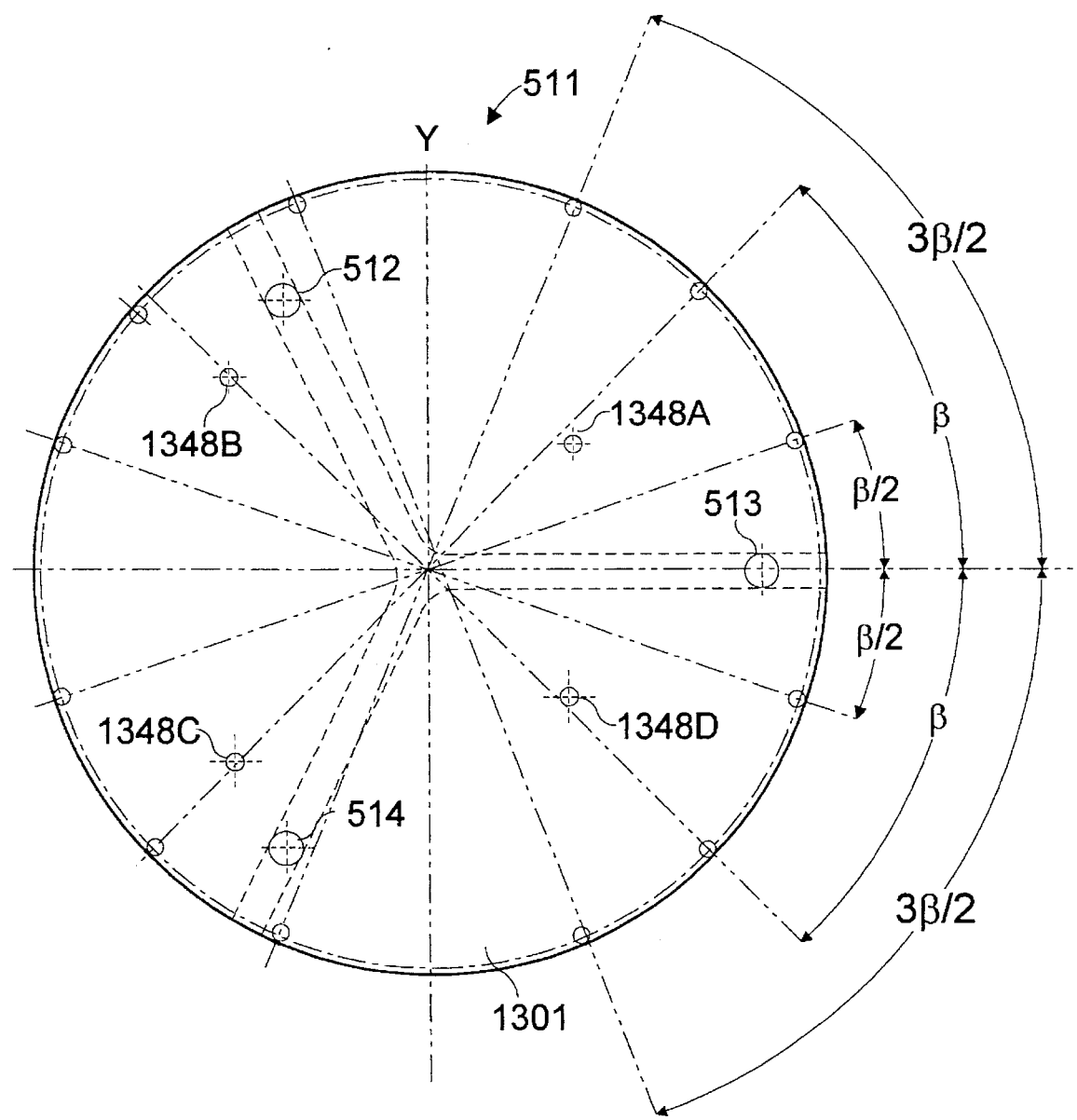
FIGS. 13A and 13B are a top view and side view, respectively, of a pedestal plate used with one embodiment of the two layer susceptor of this invention.
Figure 13B:
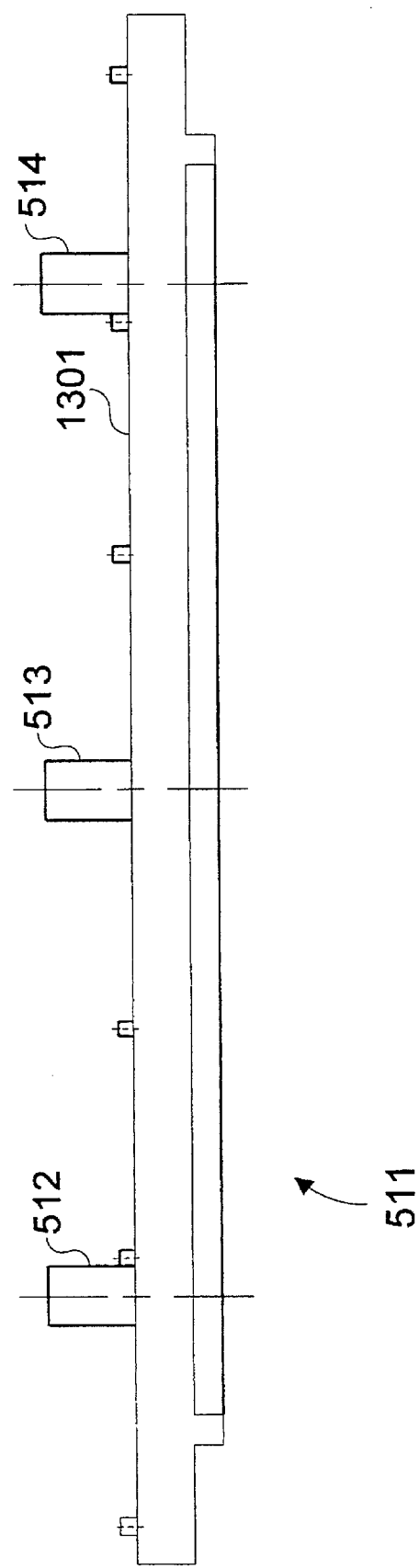

FIGS. 13A and 13B are a top view and a side view respectively of pedestal plate 511. Columns 512 to 514 have a diameter of 0.63 inches (1.60 cm) and a height of 0.88 inches (2.24 cm). Substrate support pin holes 1348A to 1348D are positioned in the same locations as described above for the other elements. The pins on upper surface 1301 of plate 511 are positioned and have the same size as the pins on the outer circumference of second layer 502. Pedestal plate 511 is made of opaque quartz that is fire polished.

Figure 14A:
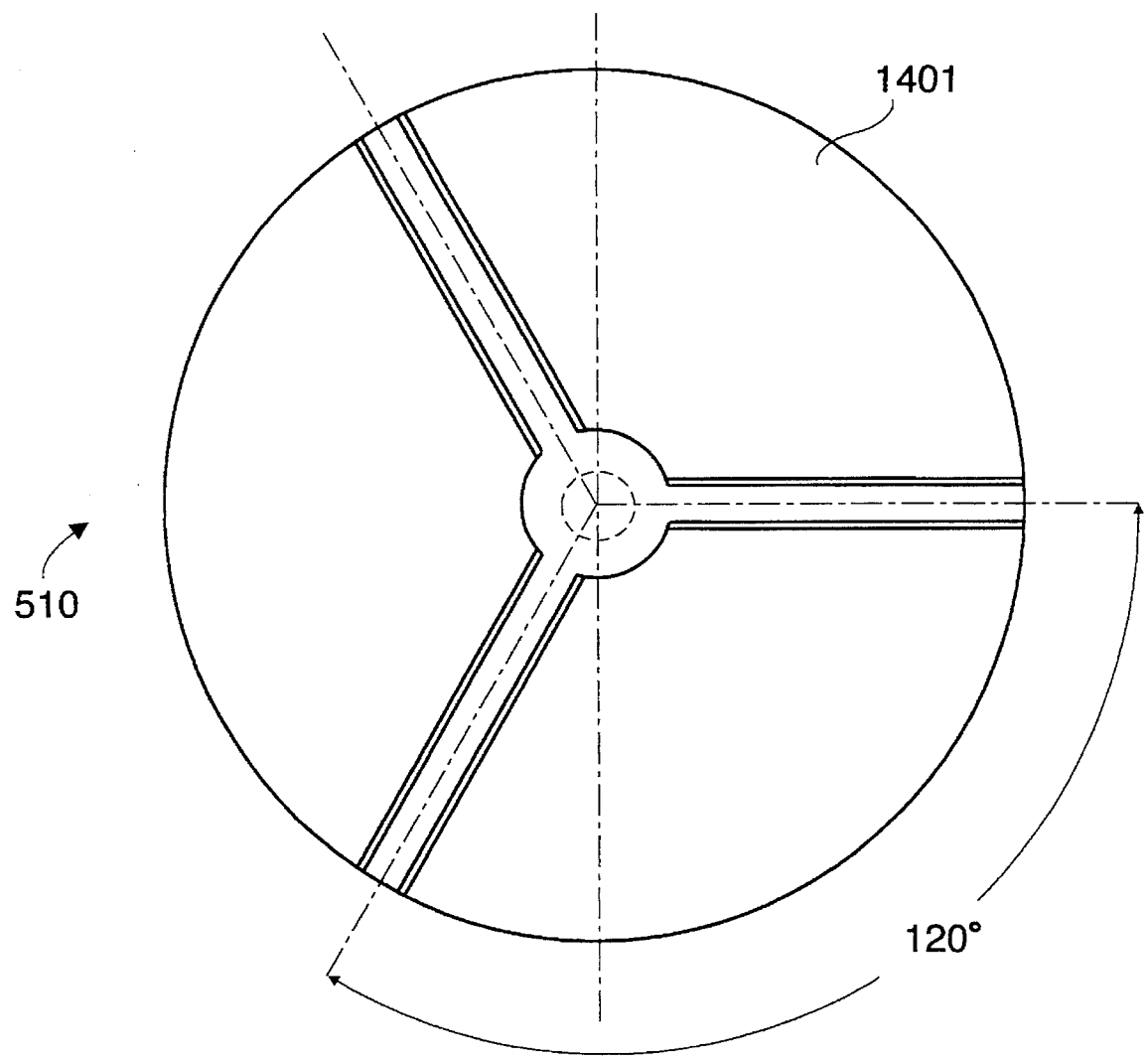
FIGS. 14A and 14B are a top view and side view, respectively, of a pedestal shaft used with one embodiment of the two layer susceptor of this invention.
Figure 14B:
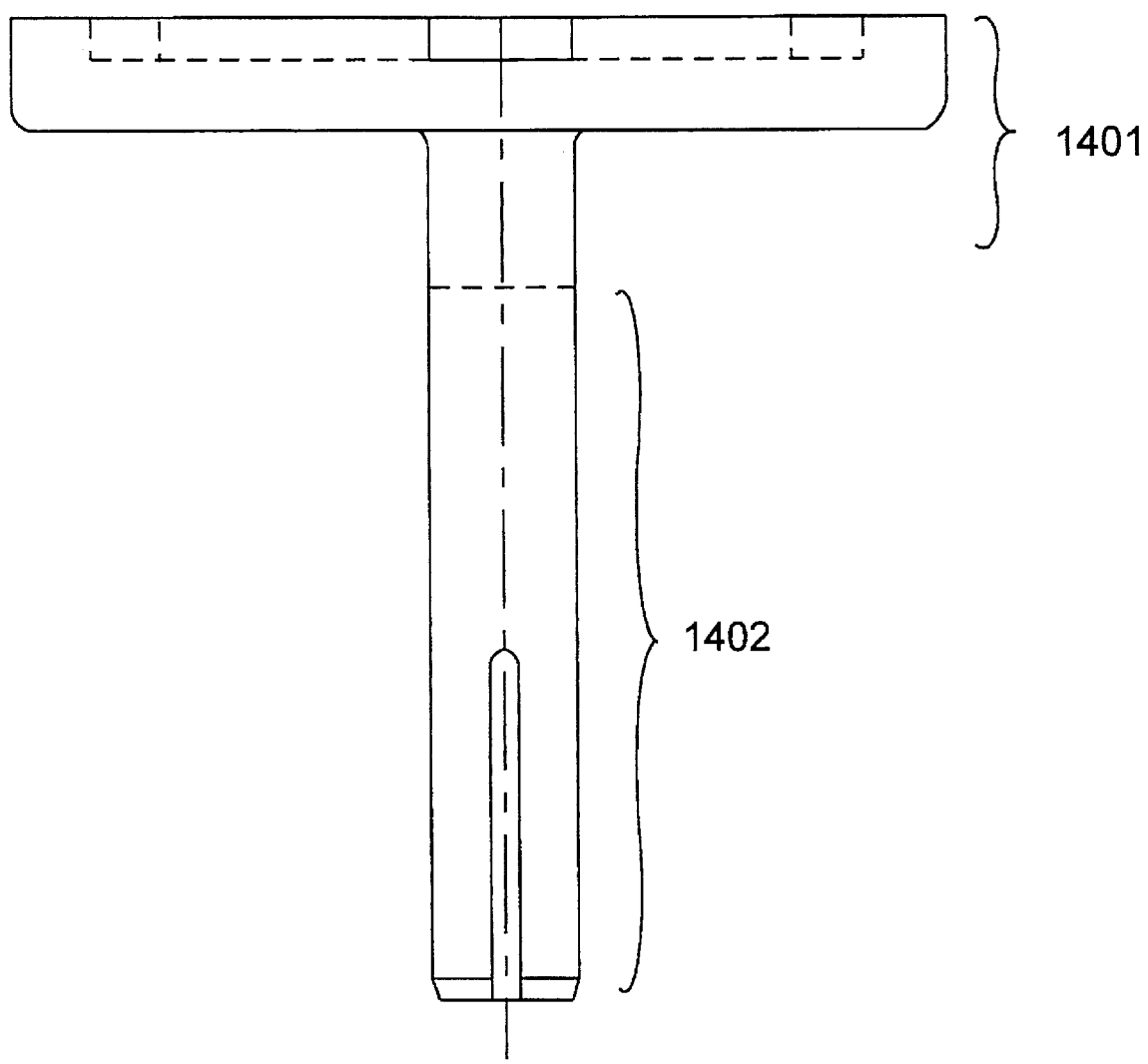

FIGS. 14A and 14B are a top view and side view, respectively of pedestal shaft 510. Top portion 1401 is made of opaque quartz, while bottom portion 1402 is made of clear quartz.

Figure 15:
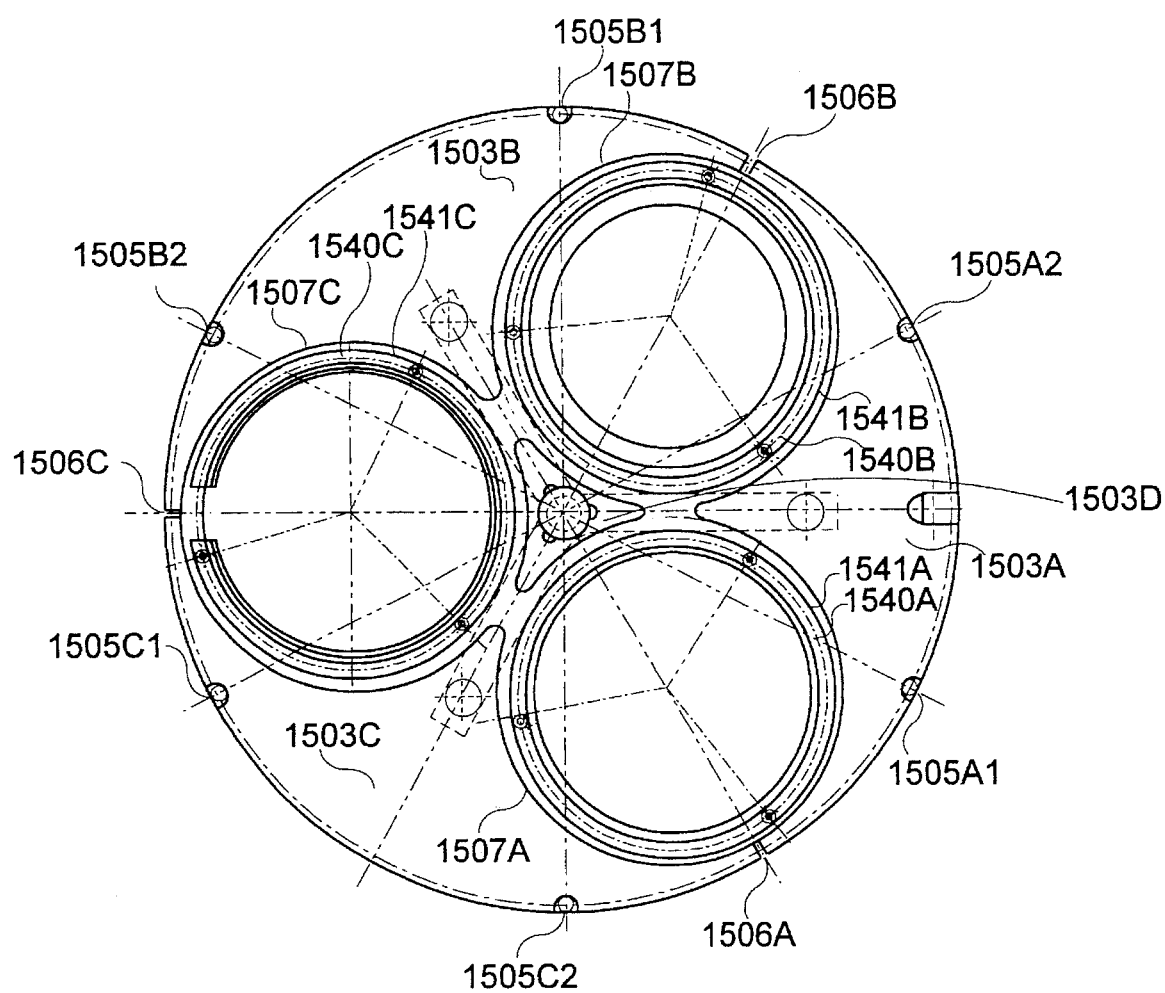
FIG. 15 is a top view of a two layer susceptor according to the principles of this invention that supports a plurality of substrates.

Susceptor 500 with heat distribution elements and a substrate surround ring was configured for a single large substrate. Susceptor 500 can be either stationary or rotated. Similarly, susceptor 500 can be modified to support a plurality of substrates rather than a single substrate. In FIG. 15, susceptor 1500 utilizes the same principles as susceptor 500, except susceptor 1500 is used for a plurality of substrates.

While not illustrated in FIG. 15, susceptor 1500 has two layers. A first layer 1501 is made up of a plurality of components that includes a plurality of substrate support rings and a substrate surround ring insert for each of the substrate surround rings as well as a plurality of heat distribution elements 1503A to 1503D. The plurality of components that make up first layer 1501 is supported by a second layer 1502. Each substrate surround ring and substrate surround ring insert are the same as those described above with dimensions appropriate for a smaller size substrate and so that description is incorporated herein by reference.

Again, the plurality of components making up first layer 1501 are made from a material that has heat transfer characteristics and emissivity similar to graphite and silicon carbide. The function of first layer 1501 is to minimize thermal gradients within substrates supported by first layer 1501, and to maintain a substantially uniform temperature surface surrounding the substrates so that process gases are not affected by temperature differentials introduced by susceptor 1500.

Similarly, the material for second layer 1502 is selected again so that the heat energy absorbed is minimized, i.e., second layer 1502 is substantially transparent to the heat energy in the RTP reactor. Consequently, second layer 1502 has no effective thermal mass, but yet second layer 1502 provides rigidity and support for first layer 1501.

The combination of first layer 1501 and second layer 1502 results in a susceptor 1500 that has the low thermal mass associated with first layer 1501 and has a substantially uniform temperature distribution in the vicinity of a substrate, but yet has the stability and rigidity to support a plurality of substrates. Further, the problems with the prior art RTP susceptors with a thin inner plate and a more massive outer rim that supported only a single substrate, as described above, are not encountered because each component in first layer 1501 has uniform thermal mass characteristics and so heat gradients caused by differences in thermal mass within a component are not created.

In this embodiment, susceptor 1500 has about a 14.25 inch (36.2 cm) diameter. Heat distribution elements 1503A to 1503C are held in position by a plurality of cylindrical pins 1505A1 to 1505C2, e.g., element 1503A has a first circular notch about pin 1505A1 and a second circular notch about pin 1505A2. Pins 1505A1 to 1505C2 are formed about the perimeter of an upper surface 1502A of layer 1502. Each heat distribution element 1503A to 1503C has a half circular notch in an outer circumferential edge surface that fits about a corresponding cylindrical pin. Heat distribution element 1503D fits over a post on a pedestal plate which has four columns instead of the three described above.

In FIG. 15, small gaps 1506A to 1506C are shown between adjacent edge surfaces of heat distribution elements 1503A to 1503C, respectively. Another small circumferential gap 1507A to 1507C between an outer circumferential edge surface 1541A to 1541C of substrate surround ring 1540A to 1540C, respectively and adjacent inner circumferential edge surfaces of heat distribution elements 1503A to 1503C also is shown. In addition, there is a small gap that continues between outer edges of elements 1503D and outer circumferential edge surfaces of substrate surround rings 1540A to 1540C. The size of the various gaps is selected so that at operating temperature the heat distribution elements at most just contact each other and contact substrate surround rings 1540A to 1540C. Thus, at operating temperatures heat distribution elements 1503A to 1503D form a heated surface about the plurality of substrates so that a heated gas flow is properly maintained over the plurality of substrates.

Figure 16:
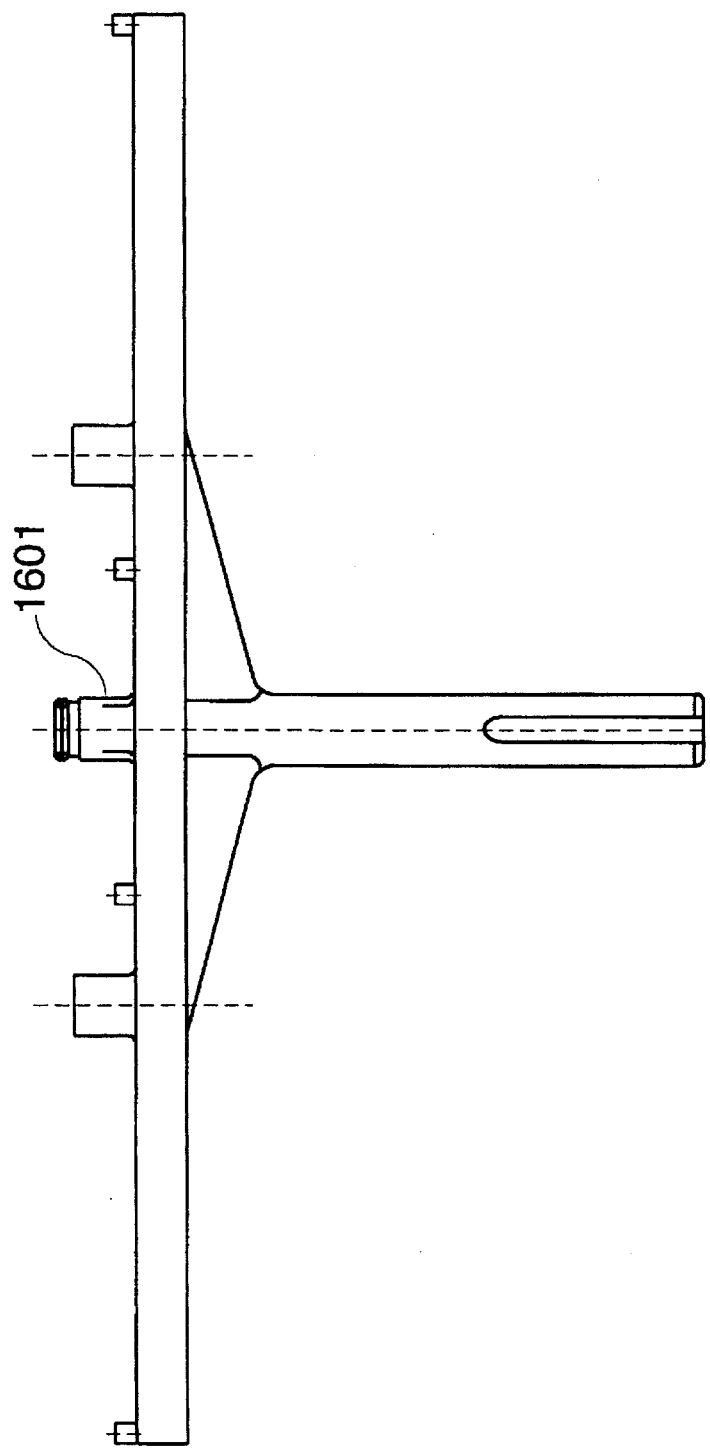
FIG. 16 is an illustration of a pedestal plate and shaft suitable for use with the two layer susceptor of FIG. 15.

FIG. 16 is an illustration of the pedestal plate and shaft for this embodiment of the invention. FIG. 16 shows column 1601 that extends through the second layer 1502 and on which heat distribution element 1503D is mounted. When this extra column is considered in conjunction with the different number of substrates and associated features of the substrate surround rings, the other elements described above for susceptor 500 can be modified by those skilled in the art for use with susceptor 1500 in view of the configuration shown in FIG. 15. Therefore, the description of the various elements is not repeated.

Figure 17:
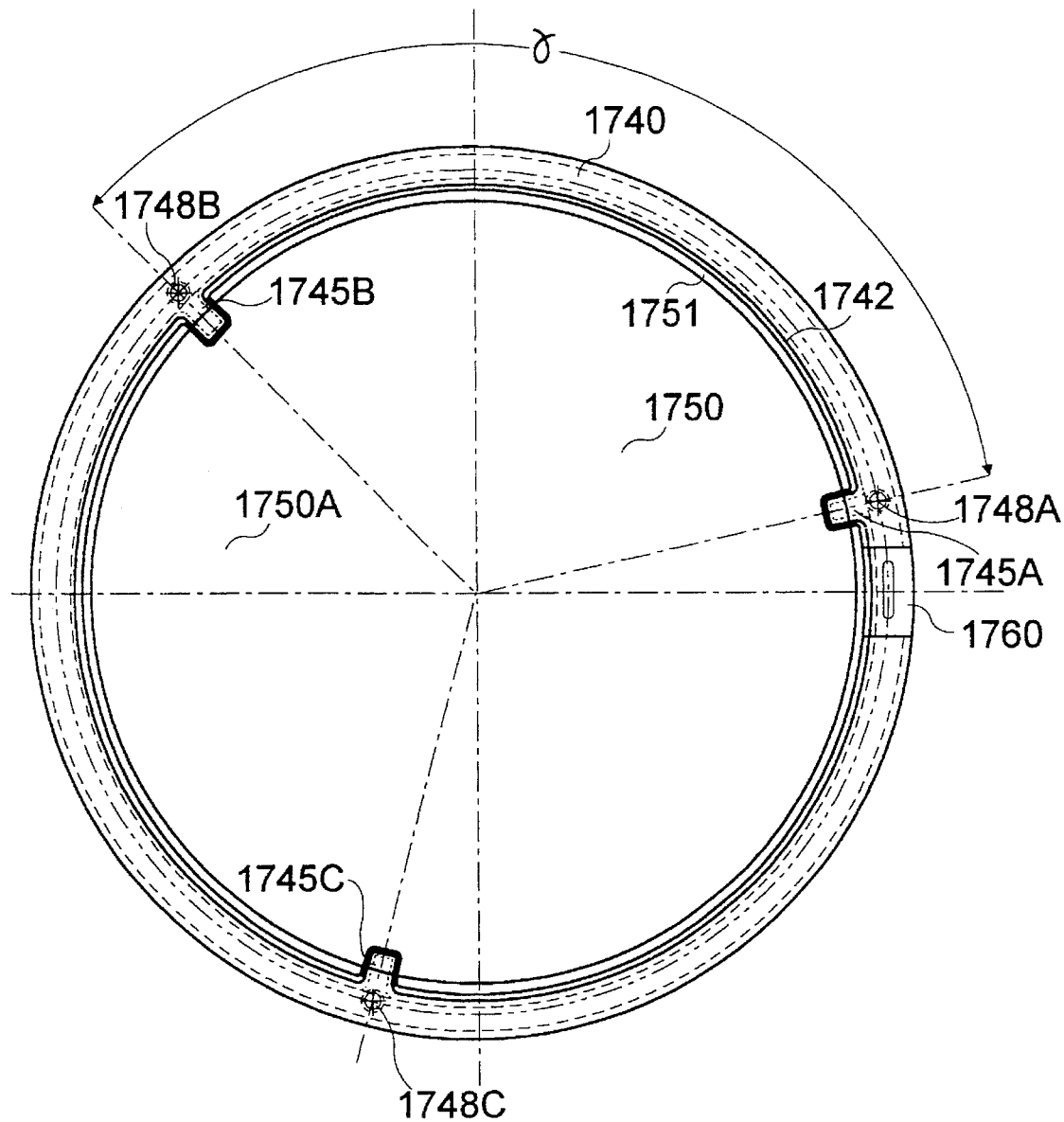
FIG. 17 is a top view of an embodiment of a substrate surround ring, a substrate surround ring insert, and a substrate surround ring gap insert that can be used in the two layer susceptor of this invention.

In the above embodiments of this invention, the substrate surround ring had a shelf on which the substrate was placed and the substrate surround ring insert had a flat surface that was the same height as the shelf on the substrate surround ring. In another embodiment, a similar concept is used except the rim surrounding the substrate is on the substrate surround ring insert. FIG. 17 is a top view of this embodiment of the invention.

In FIG. 17, only substrate surround ring 1740, substrate surround ring insert 1750, and substrate surround ring gap insert 1760 are illustrated. These components can be used to replace the for example, substrate surround ring 540 and substrate surround ring insert 550 on susceptor 500 to form another susceptor 500A. With this change and a modification for the different number of substrate support pins, the other features of susceptor 500 remain unchanged. Similarly, the components illustrated in FIG. 17 can be utilized in susceptor 1500. Therefore, only the features of the three components illustrated in FIG. 17 are described more completely below.

Substrate surround ring 1740 is a cylindrical annulus with a cut-out portion so that substrate surround ring 1740 has the shape of a C, as viewed in FIG. 17. Substrate surround ring 1740 has a plurality of lift tabs 1745A to 1745C on an inner circumferential edge surface 1742. Each lift tab is approximately rectangular in this embodiment. Each lift tab has a portion removed along a top surface so as to form a shelf at the end of the lift tab removed from inner circumferential edge surface 1742. Also, as described above, inner circumferential edge surface 1742 and the vertical edge surfaces of each lift tab are beveled so as to mate with a corresponding beveled outer circumferential edge surface of substrate surround ring insert 1750.

Substrate surround ring insert 1750, as explained more completely below, is substantially circular and has a height that is about the same as the height of the shelves on lift tabs 1745A to 1745C so that the backside of a substrate sits on an upper surface of substrate surround ring insert 1750 and the shelf on each of lift tabs 1745A to 1745C.

Substrate surround ring insert 1750 has a plurality of notches in an outer circumferential edge surface so that each notch fits about a corresponding lift tab on inner circumferential edge surface 1742 of substrate surround ring 1740. In addition, substrate surround ring insert 1750 has a rim 1751, that is the same height as substrate surround ring 1740, about the outer circumference of upper surface 1750A except where the outer circumference of upper surface 1750A is interrupted by a notch.

Substrate surround ring gap insert 1760 fills the cut-out portion in substrate surround ring 1740 so that when susceptor 500A is in the processing position, the outer circumferential edge of a substrate is completely surrounded by a rim formed from rim 1751 and substrate surround ring 1740.

Substrate surround ring 1740 includes a plurality of holes 1748A to 1748C that extend through substrate surround ring 1740. Holes 1748A to 1748C are tapered, as described above, to mate with the second tapered surface of the substrate support pins. When susceptor 500A is lowered from the processing position, ends of the substrate support pins opposite to the tapered ends contact a surface in the reaction chamber of the RTP reactor, and while susceptor 500A continues to lower, the substrate support pins cause substrate surround ring 1740 to remain stationary. Thus, the substrate is supported on the plurality of lift tabs of substrate surround ring 1740 which in turn is suspended above susceptor 500A. In this position, a substrate handling tool can be placed under the lower surface of the substrate and the substrate removed from the RTP reactor.

Figure 18A:
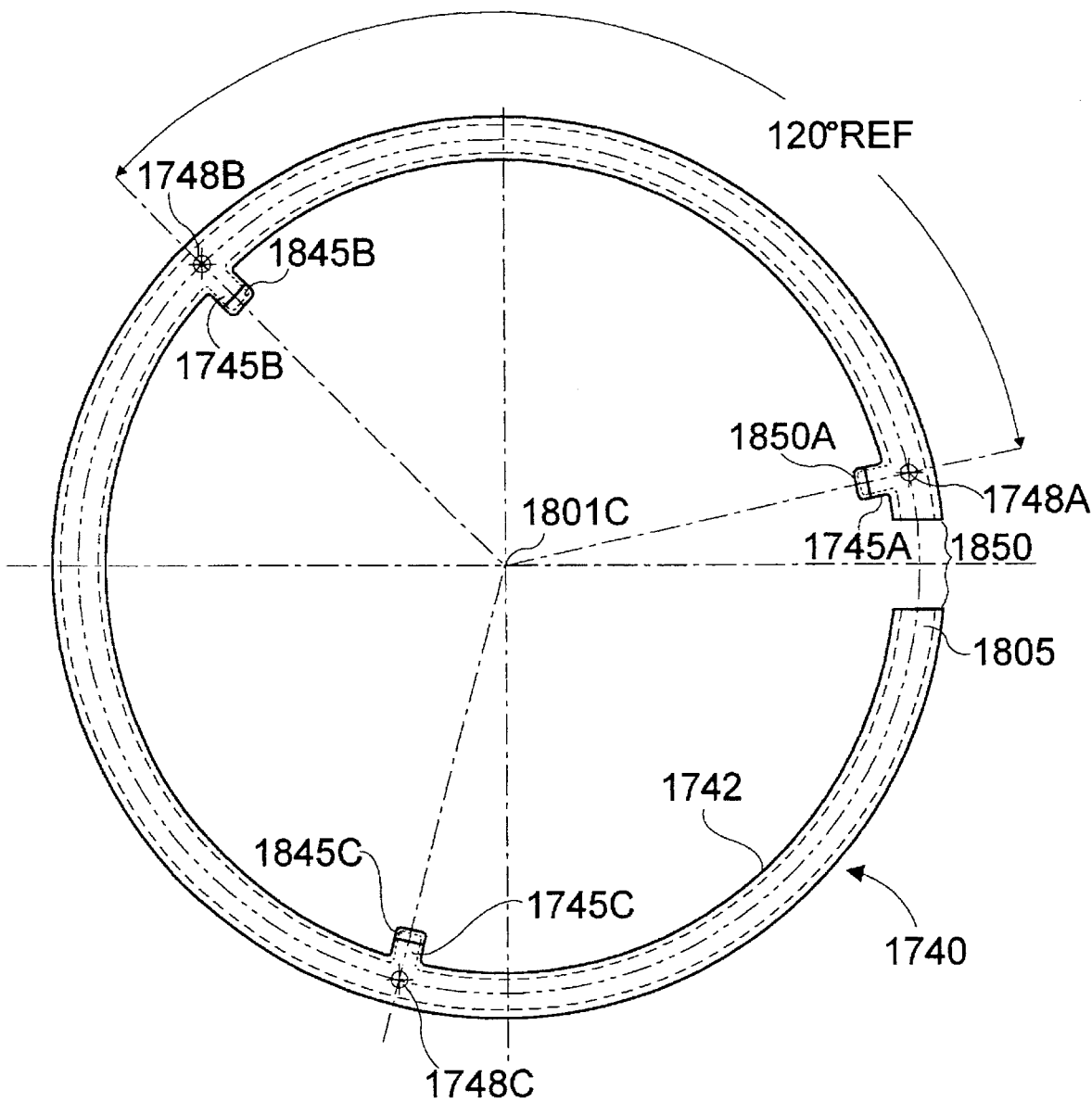
FIG. 18A is a more detailed illustration of the substrate surround ring of FIG. 17.
Figure 18B:
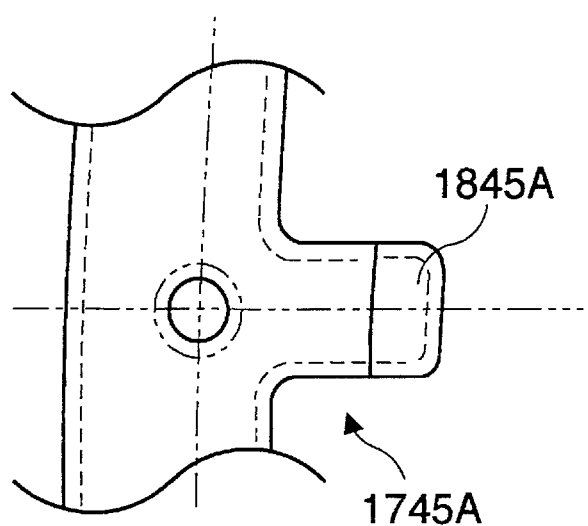
FIG. 18B is an enlarged illustration of the lift tabs of the substrate surround ring of FIG. 17.

FIG. 18A is a more detailed illustration of this embodiment of substrate surround ring 1740. As described above, the main body of substrate surround ring is an annulus 1805 with a cut-out portion 1850. Inner circumferential edge surface 1742 of annulus 1805 is beveled and has a plurality of lift tabs extending towards center 1801C of annulus 1805 from edge surface 1742. In this embodiment, annulus 1805 is divided into three equal size segments by lift tabs 1745A to 1745C, i.e., the lift tabs are spaced 120° apart. Further, a substrate support pin hole is formed in annulus 1805 on a centerline of the corresponding lift tab. A top surface of each lift tab is cut-away on the part of the lift tab most remote from the annulus 1805 to form a shelf, i.e., shelves 1845A to 1845C, that supports a substrate. FIG. 18B is a enlarged diagram of each lift tab 1745A with shelf 1845A formed in the top surface of lift tab 1745A. FIG. 18B also illustrates lift tabs 1745B and 1745C.

In this embodiment, substrate surround ring 1740 has three lift tabs that are equally spaced about the inner circumferential edge surface. However, any number of lift tabs can be used and the spacing can be adjusted to accommodate any physical or process characteristics necessary. Therefore, the present embodiment is illustrative only of the principles of the invention and is not intended to limit the invention to the specific features that are shown.

Figure 19A:
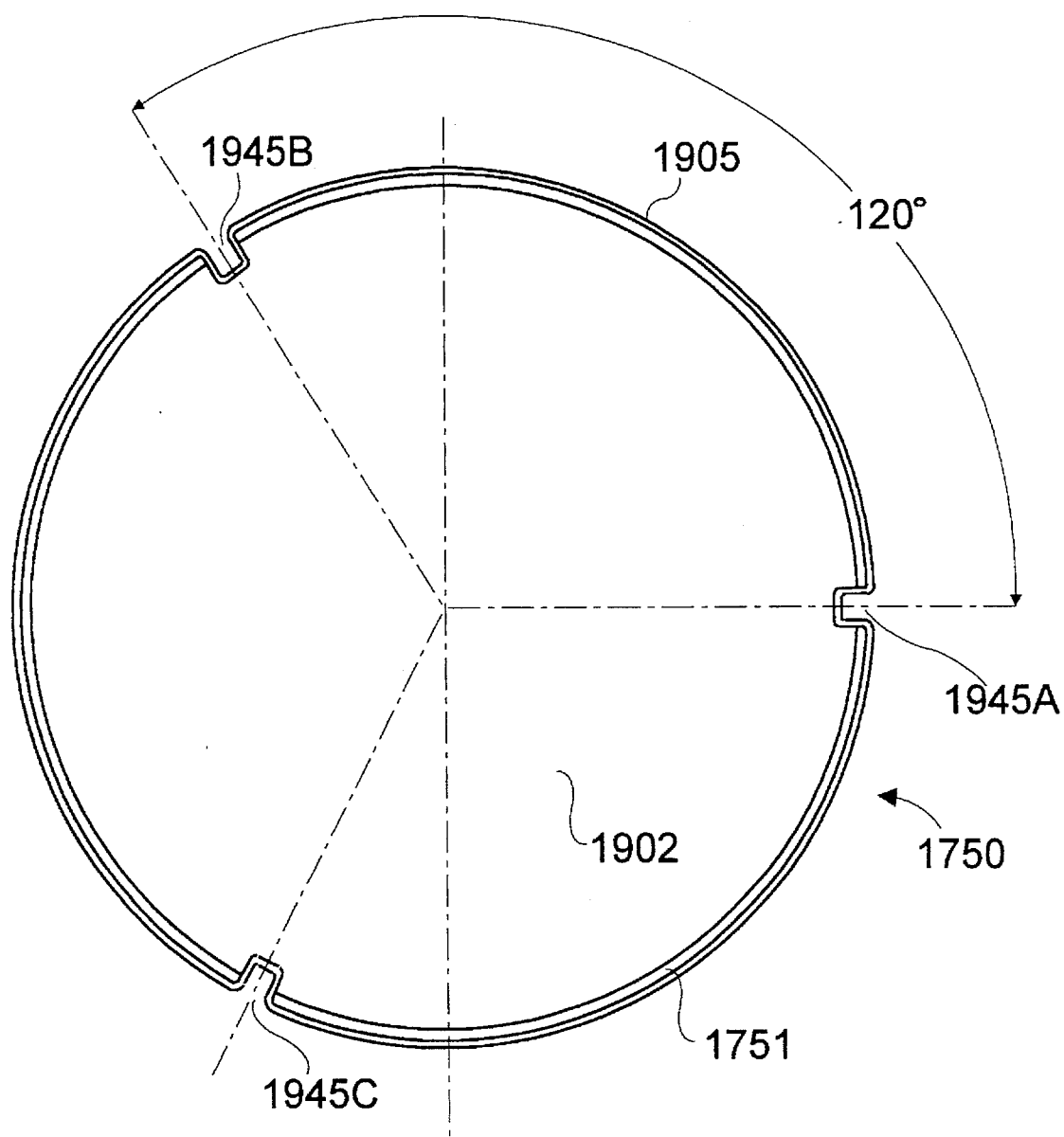
FIG. 19A is a more detailed illustration of the substrate surround ring insert of FIG. 17.

FIG. 19A is a more detailed illustration of this embodiment of substrate surround ring insert 1750. As described above, the body of substrate surround ring insert 1750 is a flat circular cylinder with a rim 1751 formed on the outer circumference of a top surface 1902, and a plurality of notches 1945A to 1945C formed in an outer circumferential beveled edge surface 1905. Outer circumferential beveled edge surface 1905 is divided into three equal size segments by notches 1945A to 1945C, i.e., the notches are spaced 120° apart. Each notch is formed so that a continuous substrate support surface and surrounding rim is formed when a lift tab on substrate surround ring 1740, is placed in the notch, i.e., the notched is mated with a lift tab.

Figure 19B:
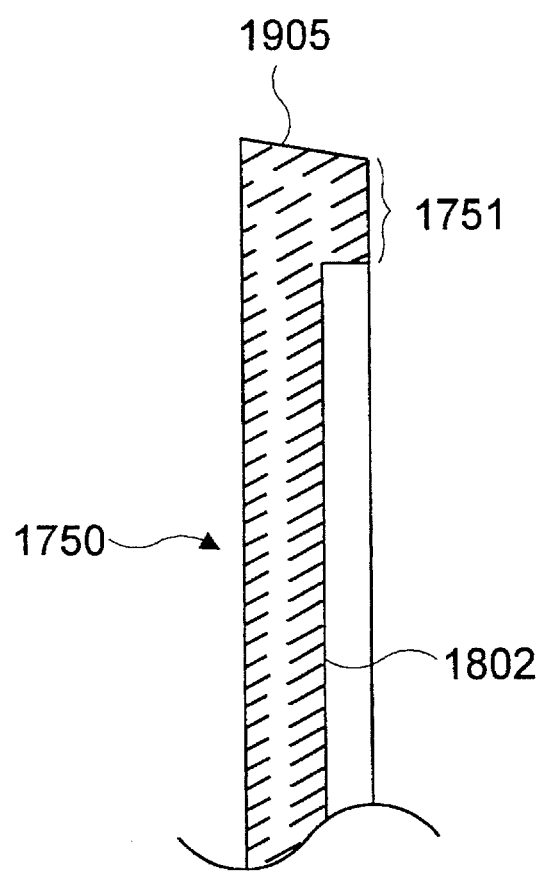
FIG. 19B is an enlarged cross-sectional view of the substrate surround ring insert of FIG. 17.

FIG. 19B is an enlarged cross-sectional view of the outer circumferential edge surface 1905 substrate surround ring insert 1750 that illustrates more clearly rim 1751, and surface 1802 that supports a substrate. The shelf on a lift tab has the same height as the height of surface 1802 and the top surface of the lift tab completes rim 1751 within the notched out portion of insert 1750.

Figure 20A:
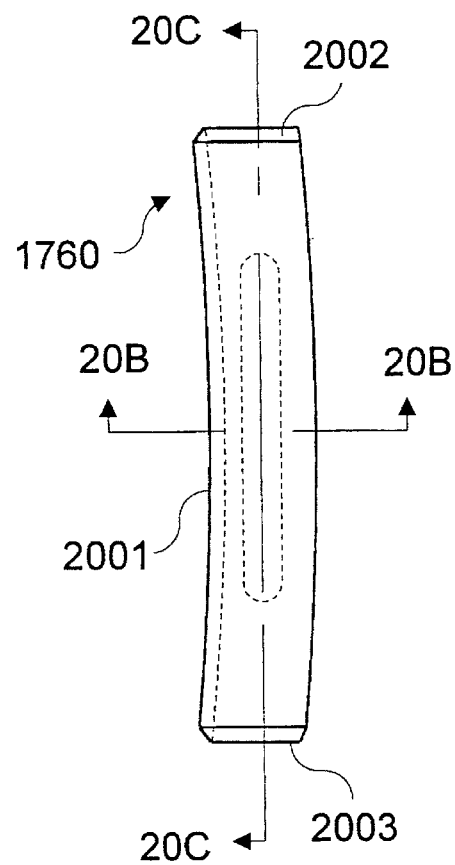
FIGS. 20A to 20C are top and side cut-away views of the substrate surround ring gap insert of FIG. 17.
Figure 20C:
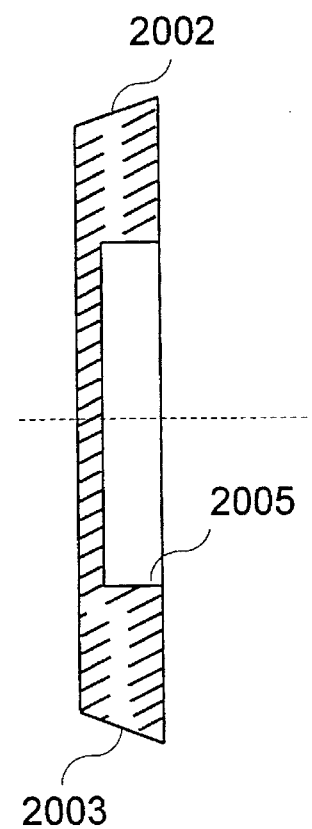
Figure 20B:
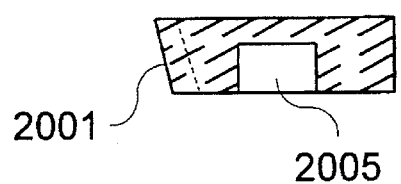

FIGS. 20A to 20C are top and side cut-away views of substrate surround ring gap insert 1760. An inner edge surface 2001 of insert 1760 is beveled to mate with insert 1750. Similarly end edge surfaces 2002 and 2003 are beveled to mate with beveled ends of substrate surround ring 1740. Also, insert 1760 has a notch 2005 in the bottom surface to engage a lip on the second layer of the susceptor as previously described.

Various embodiments of a two layer susceptor have been described above. The various embodiments are illustrative of the principles of this invention and are not intended to limit the invention to the particular features or dimensions described. For example, a two layer susceptor with a substrate surround ring or rings and heat distribution elements making up the first layer and a supportive second layer could be utilized with a rectangular or some other shape susceptor that is stationary.

I claim:

1. A rapid thermal process reactor susceptor comprising:
   a first layer comprising a plurality of components wherein said plurality of components further comprise:
      a substrate surround ring; and
      a plurality of heat distribution elements positioned about and adjacent to said substrate surround ring;
   a second layer having a first surface and a second surface opposite said first surface;
      wherein said plurality of components of said first layer is mounted on said first surface of said second layer so that said second layer supports said first layer.

2. A rapid thermal process reactor susceptor as in claim 1 wherein said second layer is substantially transparent to heat energy in said RTP reactor so that a thermal mass of said susceptor is defined by characteristics of said first layer.

3. A rapid thermal process reactor susceptor as in claim 1 said plurality of components further comprise:
   a substrate surround ring insert having a circumferential edge surface wherein said circumferential surface of said substrate surround ring insert is adjacent to an inner circumferential edge surface of said substrate surround ring.

4. A rapid thermal process reactor susceptor as in claim 3 wherein said substrate surround ring insert circumferential edge surface and substrate surround ring inner circumferential surface are beveled so that said substrate surround ring can be lifted away from said substrate surround ring insert without displacing said substrate surround ring insert.

5. A rapid thermal process reactor susceptor as in claim 1 wherein said substrate surround ring further comprises:
   a shelf about an inner circumferential edge surface of said substrate surround ring wherein said shelf extends a distance from said inner circumferential edge surface of said substrate surround ring towards an outer circumferential edge surface so that a substrate placed in said substrate surround ring is supported by said shelf.

6. A rapid thermal process reactor susceptor as in claim 5 wherein said substrate surround ring further comprises:

a rim about an outer circumferential edge surface of said substrate surround ring wherein an intersection of an inner circumferential edge surface of said rim and said shelf defines an outer edge of said shelf and said inner circumferential edge forms a wall that extends from said shelf to a top of said rim.

7. A rapid thermal process reactor susceptor as in claim 6 wherein said wall has a height that is about twice a thickness of said substrate.

8. A rapid thermal process reactor susceptor as in claim 7 wherein the outer edge of said shelf is positioned so that a gap between said wall and an edge of said substrate is in the range of about 0.05 inches (0.13 cm) to 0.2 inches (0.51 cm).

9. A rapid thermal process reactor susceptor as in claim 7 wherein the outer edge of said shelf is positioned so that said gap between said wall and an edge of said substrate is about 0.0625 inches (0.16 cm).

10. A rapid thermal process reactor susceptor as in claim 1 wherein said substrate surround ring includes first and second ends separated by a gap so that said substrate surround ring has as a shape similar to the letter C.

11. A rapid thermal process reactor susceptor as in claim 10 wherein said plurality of components further comprise:
   a substrate surround ring insert having a circumferential edge surface wherein said circumferential surface of said substrate surround ring insert is adjacent to an inner circumferential edge surface of said substrate surround ring.

12. A rapid thermal process reactor susceptor as in claim 11 wherein said substrate surround ring insert circumferential edge surface and substrate surround ring inner circumferential surface are beveled so that said substrate surround ring and be lifted away from said substrate surround ring insert without displacing said substrate surround ring insert.

13. A rapid thermal process reactor susceptor as in claim 10 wherein said substrate surround ring further comprises:
   a shelf about an inner circumferential edge surface of said substrate surround ring wherein said shelf extends a distance from said inner circumferential edge surface of said substrate surround ring towards an outer circumferential edge surface so that a substrate placed in said substrate surround ring is supported by said shelf.

14. A rapid thermal process reactor susceptor as in claim 13 wherein said substrate surround ring further comprises:
   a rim about an outer circumferential edge surface of said substrate surround ring wherein an intersection of an inner circumferential edge surface of said rim and said shelf defines an outer edge of said shelf and said inner circumferential edge forms a wall that extends from said shelf to a top of said rim.

15. A rapid thermal process reactor susceptor as in claim 14 wherein said wall has a height that is about twice a thickness of said substrate.

16. A rapid thermal process reactor susceptor as in claim 14 wherein the outer edge of said shelf is positioned so that a gap between said wall and an edge of said substrate is in the range of about 0.05 inches (0.13 cm) to 0.2 inches (0.51 cm).

17. A rapid thermal process reactor susceptor as in claim 16 wherein the outer edge of said shelf is positioned so that said gap between said wall and an edge of said substrate is about 0.0625 inches (0.16 cm).

18. A rapid thermal process reactor susceptor as in claim 14 wherein said substrate surround ring insert further comprises a protrusion having a shelf area and a rim that fits in said gap of said substrate surround ring.

19. A rapid thermal process reactor susceptor as in claim 1 wherein said substrate surround ring further comprises:

a plurality of lift tabs extending from an inner circumferential surface of said substrate surround ring.

20. A rapid thermal process reactor susceptor as in claim 1 wherein said plurality of heat distribution elements are arranged about and adjacent to said substrate surround ring so that a first gap is formed between adjacent edge surfaces of said heat distribution elements, and a second gap is formed between edge surfaces of said heat distribution elements and an outer circumferential edge surface of said substrate surround ring.

21. A rapid thermal process reactor susceptor as in claim 1 wherein said each of said plurality of heat distribution elements includes a notch in an outer circumferential edge surface.

22. A rapid thermal process reactor susceptor as in claim 21 wherein said second layer further comprises a plurality of pins extending from a surface of said second layer and positioned adjacent to an outer circumferential edge of said second layer wherein said notch in said heat distribution element fits about one of said pins.

23. A rapid thermal process reactor susceptor comprising;

a substrate surround ring having an inner circumferential edge surface with a plurality of lift tabs extending from said substrate surround ring inner circumferential edge surface; and a substrate surround ring insert having a plurality of notches in an outer circumferential edge surface so that said substrate surround ring insert fits in and mates with said substrate surround ring.

* * * * *